United States Patent
Won et al.

(10) Patent No.: US 11,437,120 B2
(45) Date of Patent: *Sep. 6, 2022

(54) MEMORY SYSTEM FOR ACTIVATING REDUNDANCY MEMORY CELL AND OPERATING METHOD THEREOF

(71) Applicant: SK hynix Inc., Icheon (KR)

(72) Inventors: Hyung-Sik Won, Cheongju (KR); Hyungsup Kim, Yongin (KR)

(73) Assignee: SK hynix Inc., Icheon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/875,375

(22) Filed: May 15, 2020

(65) Prior Publication Data

US 2020/0279612 A1 Sep. 3, 2020

Related U.S. Application Data

(63) Continuation-in-part of application No. 16/568,111, filed on Sep. 11, 2019, now Pat. No. 10,998,082, and
(Continued)

(30) Foreign Application Priority Data

Oct. 31, 2017 (KR) ........................ 10-2017-0143429
Nov. 10, 2017 (KR) ........................ 10-2017-0149360

(51) Int. Cl.
| | | |
|---|---|---|
| *G11C 16/06* | (2006.01) | |
| *G11C 29/00* | (2006.01) | |
| *G11C 29/44* | (2006.01) | |
| *G11C 16/34* | (2006.01) | |
| *G11C 13/00* | (2006.01) | |

(Continued)

(52) U.S. Cl.
CPC ........ *G11C 29/783* (2013.01); *G11C 13/0097* (2013.01); *G11C 16/30* (2013.01); *G11C 16/349* (2013.01); *G11C 29/44* (2013.01); *G11C 29/52* (2013.01); *G11C 29/76* (2013.01); *G11C 29/785* (2013.01); *G11C 29/835* (2013.01); *G11C 2029/0411* (2013.01); *G11C 2207/2236* (2013.01)

(58) Field of Classification Search
CPC ....................................................... G11C 29/44
USPC .................................................... 365/185.09
See application file for complete search history.

(56) References Cited

U.S. PATENT DOCUMENTS

| | | |
|---|---|---|
| 5,657,281 A | 8/1997 | Rao |
| 5,867,642 A | 2/1999 | Vivio et al. |

(Continued)

FOREIGN PATENT DOCUMENTS

| | | |
|---|---|---|
| KR | 100818797 B1 | 4/2008 |
| KR | 1020130037555 A | 4/2013 |

(Continued)

OTHER PUBLICATIONS

Notice of Allowance dated Dec. 7, 2020 for U.S. Appl. No. 16/122,615.

(Continued)

*Primary Examiner* — Hoai V Ho

(57) ABSTRACT

A memory system includes a memory device including a memory cell array including a plurality of memory cell groups, and a controller for selectively activating or inactivating one of the memory cell groups.

19 Claims, 26 Drawing Sheets

Related U.S. Application Data a continuation-in-part of application No. 16/122,615, filed on Sep. 5, 2018, now Pat. No. 10,936,534, which is a continuation of application No. 16/044,322, filed on Jul. 24, 2018, now Pat. No. 10,453,550.

(51) Int. Cl.
  *G11C 29/52* (2006.01)
  *G11C 16/30* (2006.01)
  *G11C 29/04* (2006.01)

(56) References Cited

U.S. PATENT DOCUMENTS

| | | | |
|---|---|---|---|
| 6,466,509 B1 | 10/2002 | Tanizaki et al. | |
| 6,754,120 B1 | 6/2004 | Bellows et al. | |
| 9,305,616 B2 | 4/2016 | Yu et al. | |
| 9,633,742 B2 | 4/2017 | Desai et al. | |
| 10,453,550 B2 * | 10/2019 | Won | G11C 16/30 |
| 10,998,082 B2 * | 5/2021 | Won | G11C 29/783 |
| 2006/0143428 A1 | 6/2006 | Noda et al. | |
| 2007/0064489 A1 | 3/2007 | Bauser | |
| 2010/0325351 A1 | 12/2010 | Bennett | |
| 2013/0311709 A1 | 11/2013 | Im et al. | |
| 2013/0329506 A1 | 12/2013 | Jeong | |
| 2016/0307645 A1 | 10/2016 | Kim et al. | |
| 2017/0092366 A1 | 3/2017 | Hwang et al. | |
| 2017/0206033 A1 | 7/2017 | Ma et al. | |

FOREIGN PATENT DOCUMENTS

| | | |
|---|---|---|
| KR | 10-2016-0141484 A | 12/2016 |
| KR | 20160141484 A | 12/2016 |
| KR | 1020170095524 A | 8/2017 |
| KR | 1020170108415 A | 9/2017 |
| WO | WO2016143170 A1 | 9/2016 |

OTHER PUBLICATIONS

Office Action for U.S. Appl. No. 16/568,111, dated Oct. 14, 2020.

* cited by examiner

MEMORY SYSTEM FOR ACTIVATING REDUNDANCY MEMORY CELL AND OPERATING METHOD THEREOF

CROSS-REFERENCE TO RELATED APPLICATIONS

The present application is a continuation-in-part application of U.S. patent application Ser. No. 16/568,111 filed on Sep. 11, 2019, which is a continuation of U.S. patent application Ser. No. 16/044,322 filed on Jul. 24, 2018 and now issued as U.S. Pat. No. 10,453,550, which claims priority to Korean patent application No. 10-2017-0143429 filed on Oct. 31, 2017; and U.S. patent application Ser. No. 16/122,615 filed on Sep. 5, 2018, which claims priority to Korean patent application No. 10-2017-0149360 filed on Nov. 10, 2017. The disclosure of each of the foregoing applications is herein incorporated herein by reference in its entirety.

BACKGROUND

1. Field

Various embodiments of the present disclosure relate to a memory device and a memory system. Particularly, embodiments relate to a memory device capable of efficiently processing data and a memory system including the memory device.

2. Description of the Related Art

Data are becoming important assets in the fourth industrial revolution, and the demands for new technology in support of transferring and analyzing large-scale data at a high data rate are increasing. For example, as artificial intelligence, autonomous driving, robotic, health care, virtual reality (VR), augmented reality (AR), and smart home technologies are spreading, demands for servers or data centers are increasing.

A legacy data center includes resources for computing, networking, and storing data, in the same equipment. However, a future large-scale data center may construct resources individually and then logically restructure the resources. For example, in the large-scale data center, the resources may be modularized at the level of racks, and the modularized resources may be restructured and supplied according to their usage. Therefore, a converged storage or memory device, which can be used for the future large-scale data center, is demanded.

SUMMARY

Various embodiments of the present disclosure are directed to a memory device and a memory system capable of selectively using a plurality of memory cell groups included in a memory cell array to improve power consumption, operation speed, data reliability and memory capacity.

In an embodiment, a memory system includes: a memory device including: a memory cell array including normal memory cells and redundancy memory cells suitable for replacing failed memory cell among the normal memory cells; and a device controller suitable for activating reserved memory cells which are among the redundancy memory cells and not used to replace the failed memory cell, and generating a second signal associated with the reserved memory cells; and a memory controller suitable for assigning an address to enable accessing of the reserved memory cells in response to the second signal.

In an embodiment, a memory system includes: a memory device including: a memory cell array including normal memory cells and redundancy memory cells suitable for replacing failed memory cell among the normal memory cells; and a device controller suitable for activating reserved memory cells which are among the redundancy memory cells and not used to replace the failed memory cell; and a memory controller suitable for control the memory device, when a first memory cells are accessed more than a threshold access number, to move data stored in the first memory cells to the reserved memory cells and replace the first memory cells with the reserved memory cells.

In an embodiment, a memory device includes: a memory cell array; a sense amplifier suitable for amplify data stored in the memory cell array; a first memory cell sub-array included in the memory cell array directly coupled to the sense amplifier; a switch coupled to the first memory cell sub-array; and a second memory cell array included in the memory cell array coupled to the sense amplifier through the first memory cell sub-array and the switch; wherein when the switch is enabled, the first memory cell sub-array has a first operation speed, and the second memory cell sub-array has a second operation speed slower than the first operation speed, and wherein when the switch is disabled, a bit line loading associated with the second memory cell sub-array is decreased, and the first memory cell sub-array has a third operation speed faster than the first operation speed.

In an embodiment, a memory system includes: a plurality of memory devices, each of the plurality of memory devices including: a memory cell array; a sense amplifier suitable for amplify data stored in the memory cell array; a first memory cell sub-array included in the memory cell array directly coupled to the sense amplifier; a switch coupled to the first memory cell sub-array; and a second memory cell array included in the memory cell array coupled to the sense amplifier through the first memory cell sub-array and the switch; wherein when the switch is enabled, the memory device operates as a normal mode, and when the switch is disabled, the memory device operates as a fast mode faster than the normal mode, a controller suitable for dynamically set a mode of each of the plurality of memory devices based on requests externally provided, by controlling the switch of each of the plurality of memory devices.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
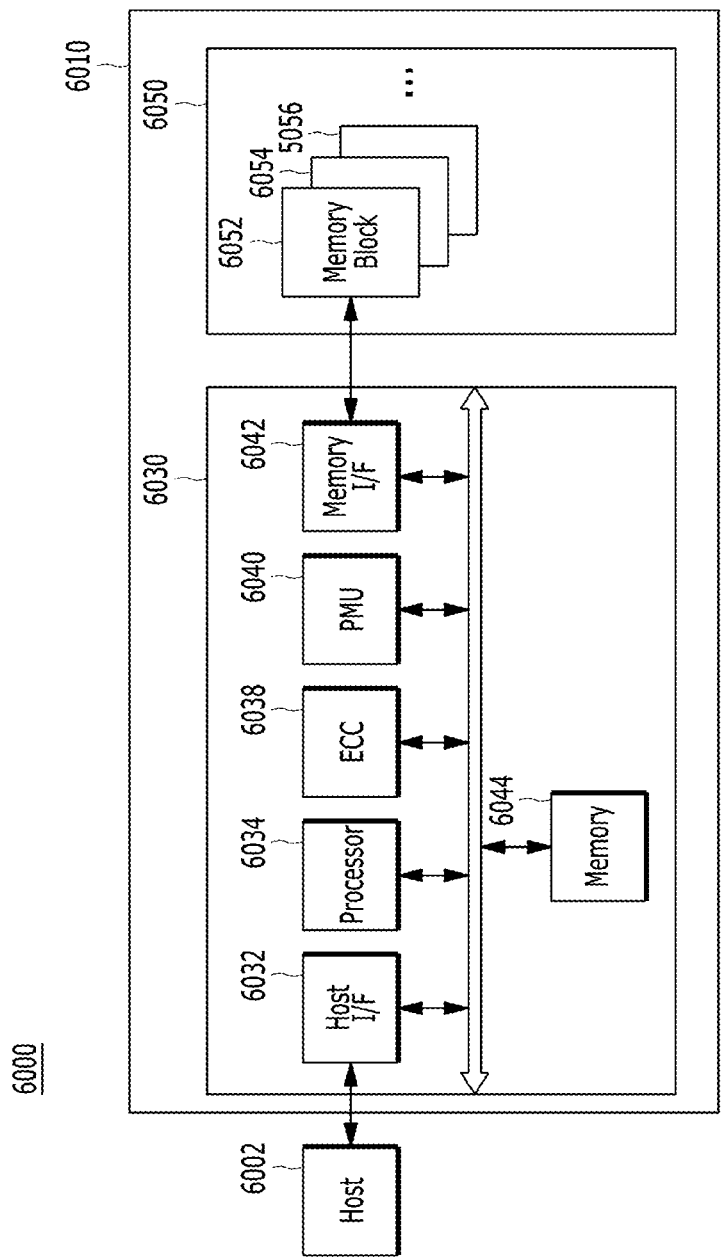
FIG. 1 is a block diagram illustrating a data processing system including a memory system in accordance with an embodiment of the present disclosure.

Various embodiments of the present disclosure are described below in more detail with reference to the accompanying drawings. The disclosure may be embodied in different other embodiments, forms, and variations thereof, and should not be construed as being limited to the embodiments set forth herein. Rather, the described embodiments are provided so that this disclosure will be thorough and complete, and will fully convey the disclosure to those skilled in the art to which this invention pertains. Throughout the disclosure, like reference numerals refer to like parts throughout the various figures and examples of the disclosure.

It will be understood that, although the terms "first," "second," "third," and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to," or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present disclosure.

Referring to FIG. 1, the data processing system 6000 may include a host 6002 operatively coupled to a memory system 6010.

The host 6002 may include, for example, a portable electronic device, such as a mobile phone, an MP3 player, or a laptop computer, or an electronic device, such as a desktop computer, a game player, a TV, a projector, or the like.

The memory system 6010 may perform a specific function or operation in response to a request from the host 6002, and may store data to be accessed by the host 6002. The memory system 6010 may be used as a main memory system or an auxiliary memory system of the host 6002. The memory system 6010 may be implemented with any one of various types of storage devices, which may be electrically coupled with the host 6002, according to a protocol of a host interface. Examples of the storage devices include a solid state drive (SSD), a multimedia card (MMC), an embedded MMC (eMMC), a reduced size MMC (RS-MMC) or micro-MMC, a secure digital (SD) card, a mini-SD or micro-SD, a universal serial bus (USB) storage device, a universal flash storage (UFS) device, a compact flash (CF) card, a smart media (SM) card, a memory stick, and the like.

The storage device for the memory system 6010 may be implemented with a volatile memory device, such as any of a dynamic random access memory (DRAM) and a static RAM (SRAM), and/or a nonvolatile memory device such as any of a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM), and a flash memory.

The memory system 6010 may include a memory device 6050, which stores data to be accessed by the host 6002, and a controller 6030, which may control an operation for storing data in the memory device 6050.

The controller 6030 and the memory device 6050 may be integrated into a single semiconductor device, which may be any of the various types of memory systems described above.

The memory system 6010 may be configured as a part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3D television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, any of various electronic devices configuring a computer network, any of various electronic devices configuring a telematics network, a radio frequency identification (RFID) device, or any of various components configuring a computing system.

The memory device 6050 may be a nonvolatile memory device, and may retain data stored therein even when an electrical power is not supplied. The memory device 6050 may store data provided from the host 6002 in a write operation, and provide data stored therein to the host 6002 in a read operation. The memory device 6050 may include a plurality of memory blocks 6052 to 6056, each of the memory blocks 6052 to 6056 may include a plurality of pages. Each of the plurality of pages may include a plurality of memory cells to which a corresponding one of a plurality of word lines (WL) is electrically coupled.

The controller 6030 may control overall operations of the memory device 6050, such as read, write, program, and erase operations. The controller 6030 may control the memory device 6050 in response to a request from the host 6002. The controller 6030 may provide data, read from the memory device 6050, to the host 6002, and/or may store data, provided by the host 6002, into the memory device 6050.

The controller 6030 may include a host interface (I/F) unit 6032, a processor 6034, an error correction code (ECC) unit 6038, a power management unit (PMU) 6040, a memory device controller such as a memory interface (I/F) unit 6042, and a memory 6044, which are operatively coupled to each other through an internal bus.

The host interface unit 6032 may process requests and data provided by the host 6002, and may communicate with the host 6002 through at least one of various interface protocols such as a universal serial bus (USB), a multimedia card (MMC), peripheral component interconnect-express (PCI-E), a small computer system interface (SCSI), a serial-attached SCSI (SAS), a serial advanced technology attachment (SATA), a parallel advanced technology attachment (PATA), a small computer system interface (SCSI), an enhanced small disk interface (ESDI), and integrated drive electronics (IDE). The host interface unit 6032 may be driven by a firmware that is referred to as a "host interface layer (HIL)."

The ECC unit 6038 may detect and correct errors in data read from the memory device 6050 during a read operation. When the number of error bits is greater than or equal to a threshold number of correctable error bits, the ECC unit 6038 may not correct the error bits, but may output an error correction fail signal indicating a failure in correcting the error bits.

The ECC unit 6038 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or a combination thereof. The ECC unit 6038 may include all or some of circuits, modules, systems, or devices for performing the error correction operation based on at least one of the above described codes.

The PMU 6040 may provide power for operating the controller 6030 and manage the power of the controller 6030.

The memory interface unit 6042 may serve as an interface for handling commands and data transferred between the controller 6030 and the memory device 6050, so as to allow the controller 6030 to control the memory device 6050 in response to a request from the host 6002. The memory interface unit 6042 may generate a control signal for controlling the memory device 6050, and may process data to be written into or outputted from the memory device 6050 under the control of the processor 6034, when the memory device 6050 is a flash memory and, in particular, when the memory device 6050 is a NAND flash memory.

The memory 6044 may serve as a working memory of the memory system 6010, and may store temporary or transactional data for operating or driving the memory system 6010. The controller 6030 may control the memory device 6050 in response to a request from the host 6002. The controller 6030 may deliver data read from the memory device 6050 to the host 6002, may store data from the host 6002 in the memory device 6050. The memory 6044 may be used to store data required for the controller 6030 and the memory device 6050 in order to perform the read and write operations of the memory device 6050.

The memory 6044 may be implemented with a volatile memory. The memory 6044 may be implemented with a static random access memory (SRAM) or a dynamic random access memory (DRAM). Although FIG. 1 illustrates the memory 6044 that is disposed within the controller 6030, embodiments are not limited thereto. That is, the memory 6044 may be located inside or outside the controller 6030. In another embodiment, the memory 6044 may be embodied by an external volatile memory having a memory interface that transfers data and/or signals between the memory 6044 and the controller 6030.

The processor 6034 may control the overall operations of the memory system 6010. The processor 6034 may drive or execute a firmware to control the overall operations of the memory system 6010. The firmware may be referred to as a flash translation layer (FTL).

A FTL may perform an operation as an interface between the host 6002 and the memory device 6050. The host 6002 may transmit requests for write and read operations to the memory device 6050 through the FTL.

The FTL may manage operations such as address mapping, garbage collection, wear-leveling, and so forth. Particularly, the FTL may store mapping data. Therefore, the controller 6030 may perform an address mapping operation by mapping a logical address, which is provided by the host 6002, to a physical address of the memory device 6050 through the use of the mapping data. Also, through the address mapping operation based on the mapping data, when the controller 6030 updates data on a particular page, the controller 6030 may program new data on another empty page, and may invalidate old data on the particular page, due to a characteristic of a flash memory device that is the memory device 6050. Further, the controller 6030 may store mapping data for the new data into the FTL.

The processor 6034 may be implemented with a microprocessor or a central processing unit (CPU). The memory system 6010 may include one or more processors.

A management unit (not shown) may be included in the processor 6034. The management unit may perform bad block management of the memory device 6050. The management unit may find bad memory blocks included in the memory device 6050 and perform bad block management on the bad memory blocks. The bad memory block is a memory block that is in an unsatisfactory condition for further use. When the memory device 6050 is a flash memory, for example, a NAND flash memory, a program failure may occur during a write operation, for example, during a program operation, due to characteristics of a NAND logic function. During the bad block management, data of the program-failed memory block or the bad memory block may be programmed into a new memory block. The bad memory blocks may seriously aggravate the utilization efficiency of the memory device 6050 having a 3D stack structure and the reliability of the memory system 6010. To overcome these drawbacks, reliable bad block management is required.

Figure 2:
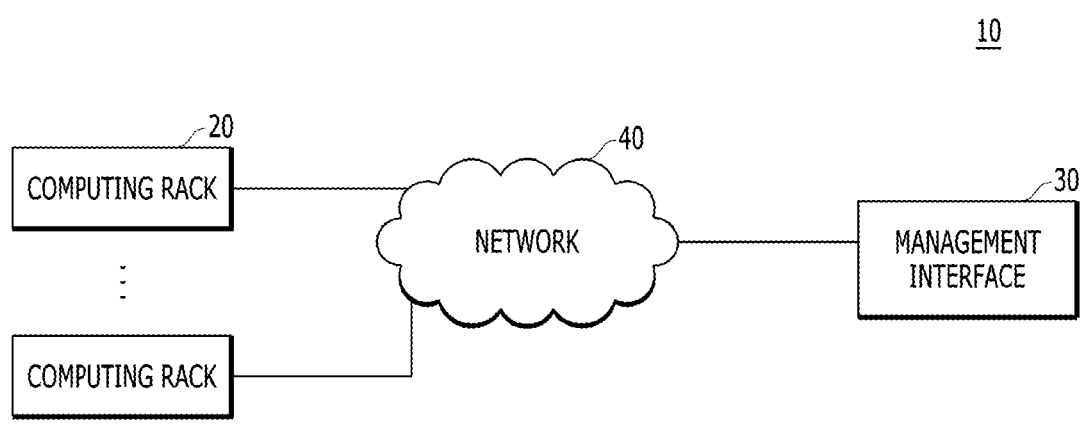
FIG. 2 is a block diagram illustrating a data processing system.

FIG. 2 is a block diagram illustrating a data processing system 10. Referring to FIG. 2, the data processing system 10 may include a plurality of computing racks 20, a management interface 30, and a network 40 for communication between the computing racks 20 and the management interface 30. The data processing system 10 having this rack-scale architecture may be used by a data center for processing large-scale data.

Each of the computing racks 20 may individually implement one computing device. Alternatively, each of the computing racks 20 may be combined with other computing racks to implement one computing device. The specific structures and operations of the computing racks 20 will be described later on.

The management interface 30 may provide an interactive interface for a user to control, administrate or manage the data processing system 10. The management interface 30 may be realized using an arbitrary type of a computing device that includes any of a computer, a multi-processor system, a server, a rack-mount server, a blade server, a lap-top computer, a notebook computer, a tablet computer, a wearable computing device, a network device, a web device, a distributed computing system, a processor-based system, a consumer electronic device, and so on.

According to some embodiments of the present disclosure, the management interface 30 may be realized by a distributed system having operation functions which may be performed by the computing racks 20 or having user interface functions which may be performed by the management interface 30. According to other embodiments of the present disclosure, the management interface 30 may be realized by a virtual cloud server that includes multi-computing devices distributed through the network 40. The management interface 30 may include a processor, an input/output subsystem, a memory, a data storage device, and a communication circuit.

The network 40 may transfer/receive data between the computing racks 20 and the management interface 30 and/or between the computing racks 20. The network 40 may be realized by an appropriate number of various wired and/or wireless networks. For example, the network 40 may include a publicly accessible global network, such as a wired or wireless Local Area Network (LAN), a Wide Area Network (WAN), a cellular network, and/or the Internet. In addition, the network 40 may include an appropriate number of auxiliary network devices, such as auxiliary computers, routers, and switches.

Figure 3:
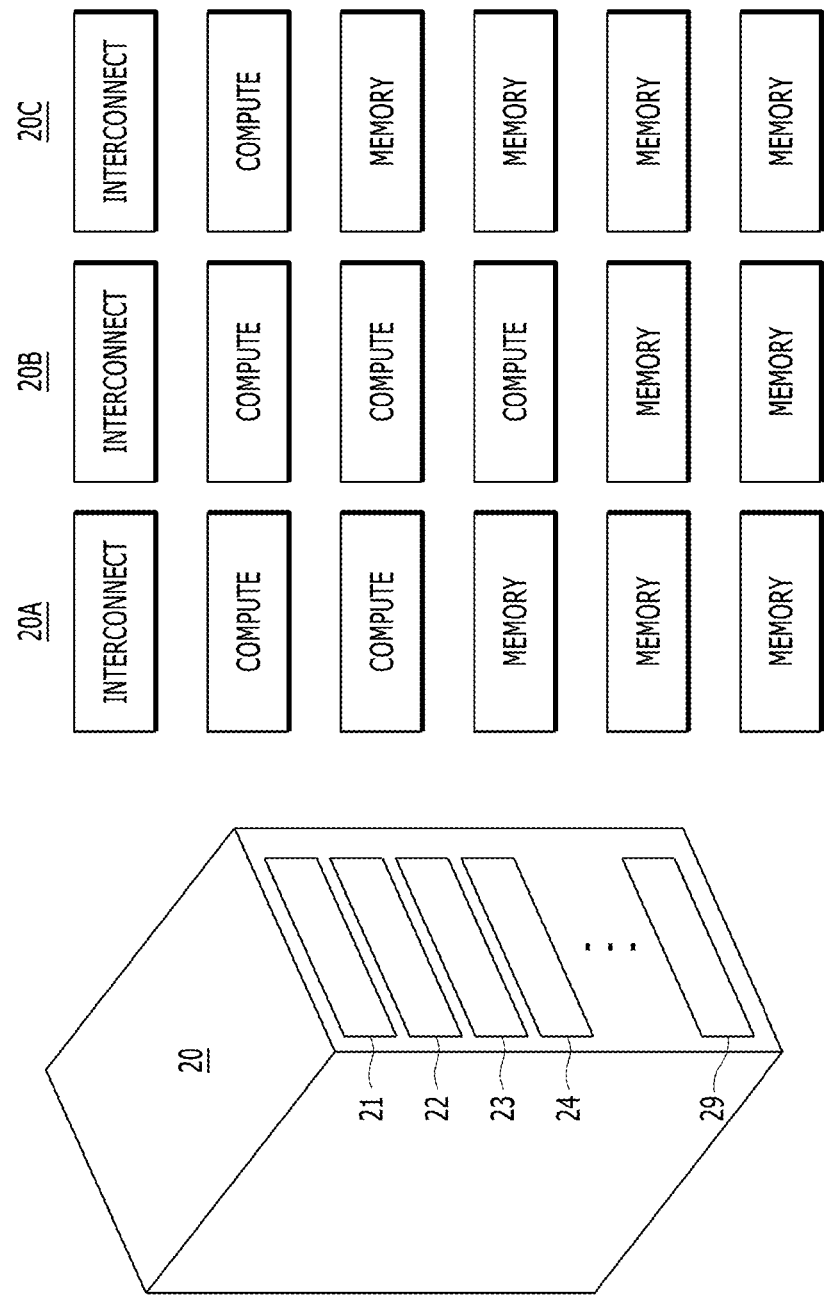
FIGS. 3 and 4 illustrate a computing device in accordance with an embodiment of the present disclosure.

FIG. 3 illustrates a computing device having a rack structure in accordance with an embodiment of the present disclosure.

Referring to FIG. 3, a computing rack 20 may include constituent elements in various forms, and structures, shapes, and names of the constituent elements are not limited. For example, the computing rack 20 may include a plurality of drawers 21 to 29. Each of the drawers 21 to 29 may include a plurality of modules, each of which may include a plurality of blades.

In various embodiments of the present disclosure, the computing rack 20 may be realized by a combination of appropriate numbers of compute blades, memory blades, and/or interconnect blades. Herein, it is defined that the computing rack 20 is realized by a combination of a plurality of blades, but the computing rack 20 may also be realized by diversely named elements such as drawers, modules, trays, boards, sashes, or units. The computing rack 20 may have a structure where the constituent elements of the computing rack 20 are disaggregated and classified according to their functions for the sake of convenience in realization. Although not limited, the computing rack 20 may have a structure of an interconnect blade, a compute blade, and a memory blade in a classification order from the top. The computing rack 20 and a computing device including the computing rack 20 may be referred to as 'a rack-scale system' or 'a disaggregated system.'

In an embodiment of the present disclosure, a computing device may be realized by one computing rack 20. In other embodiments, the computing device may be realized by all constituent elements of two or more computing racks 20, realized by some of constituent elements of two or more computing racks 20, or some of constituent elements of one computing rack 20.

In various embodiments of the present disclosure, a computing device may be realized by a combination of appropriate numbers of compute blades, memory blades, and interconnect blades that are included in the computing rack 20. As illustrated in FIG. 3, a computing rack 20A may include two compute blades, three memory blades, and one interconnect blade. A computing rack 20B may include three compute blades, two memory blades, and one interconnect blade. A computing rack 20C may include one compute blade, four memory blades, and one interconnect blade.

Although FIG. 3 illustrates a case where the computing rack 20 is realized by appropriate numbers of compute blades, memory blades, and interconnect blades, the computing rack 20 may include additional constituent elements that may be included in typical servers, such as a power system, a cooling system, an input/output device, and so on.

Figure 4:
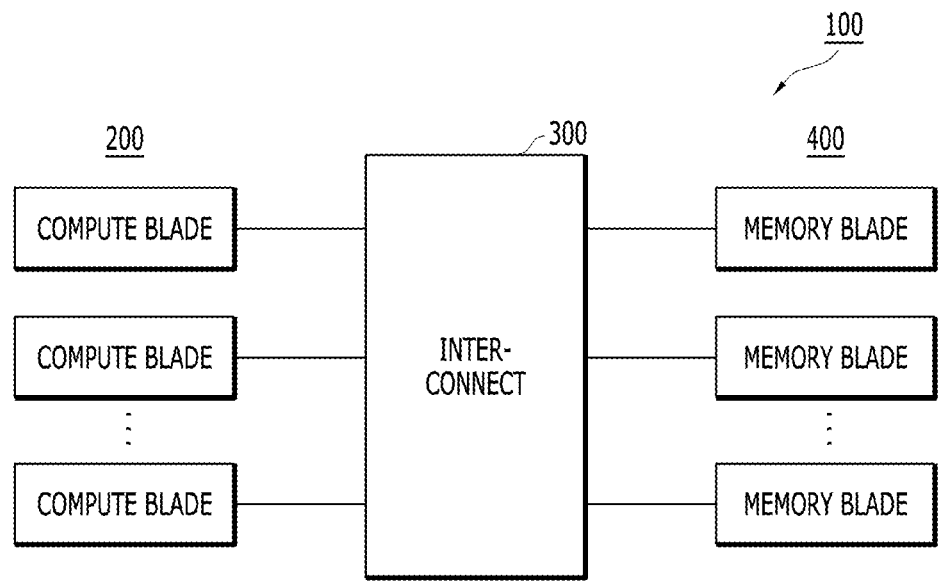

FIG. 4 illustrates a computing device 100 in accordance with an embodiment of the present disclosure.

Referring to FIG. 4, the computing device 100 may include a plurality of compute blades 200, a plurality of memory blades 400, and an interconnect blade 300. The compute blades 200 may be called pooled compute blades or pooled compute systems. Similarly, the memory blades may be called pooled memory blades or pooled memory systems. Herein, it is defined that the computing device 100 is realized by a combination of a plurality of blades, but the computing device 100 may also be realized by diversely named elements such as drawers, modules, trays, boards, sashes, or units.

Each of the compute blades 200 may include one or more of processing elements such as a processor, a processing/control circuit, a Central Processing Unit (CPU), and so on.

Each of the memory blades 400 may include one or more memories, such as volatile memories, non-volatile memories, or a combination thereof. For example, each of the memory blades 400 may include Dynamic Random Access Memories (DRAMs), flash memories, memory cards, hard disk drives (HDDs), solid state drives (SSDs), or a combination thereof.

Each of the memory blades 400 may be divided, allocated, or designated by and used by one or more processing elements that are included in each of the compute blades 200. Also, each of the memory blades 400 may store one or more operating systems (OS) that may be initialized and/or executed by the compute blades 200.

The interconnect blade 300 may include a communication circuit, a communication device, or a combination thereof, which may be divided, allocated, or designated by and used by one or more processing elements included in each of the compute blades 200. For example, the interconnect blade 300 may be realized by an arbitrary number of network interface ports, interface cards, or interface switches. The interconnect blade 300 may use protocols related to one or more wired communication technologies for communication. For example, the interconnect blade 300 may support communication between the compute blades 200 and the memory blades 400 based on one or more of protocols such as PCIe (Peripheral Component Interconnect Express), QPI (QuickPath Interconnect), Ethernet, and the like.

Figure 5:
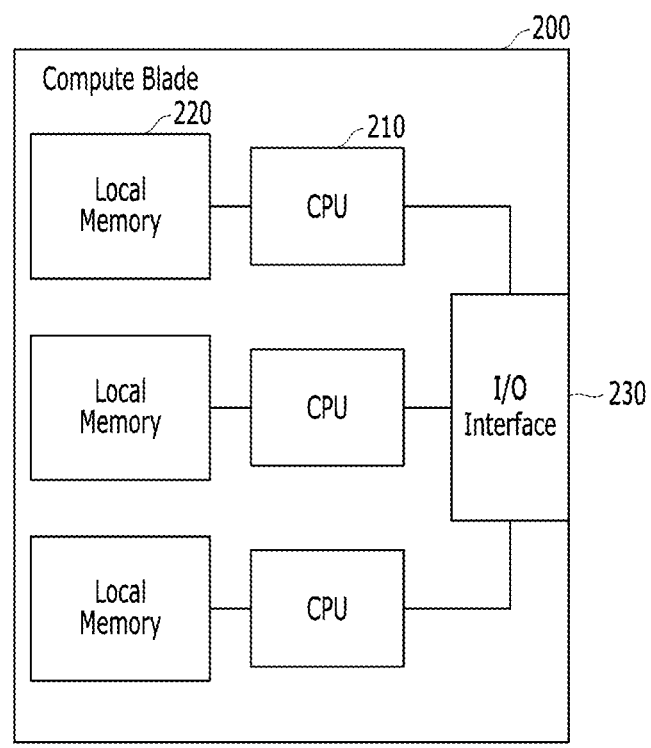
FIG. 5 is a block diagram illustrating a compute blade in accordance with an embodiment of the present disclosure.

FIG. 5 is a block diagram illustrating a compute blade 200 in accordance with an embodiment of the present disclosure.

Referring to FIG. 5, the compute blade 200 may include one or more Central Processing Units (CPUs) 210, one or more local memories 220, and an input/output (I/O) interface 230.

The CPUs 210 may divide, allocate, or designate one or more memory blades to be used, among the memory blades 400 illustrated in FIG. 4. Also, the CPUs 210 may initialize the one or more memory blades, and perform a data read operation and/or a data write (i.e., program) operation on the one or more memory blades.

The local memories 220 may store data to perform an operation of the CPUs 210. In various embodiments of the present disclosure, the local memories 220 may be in a one-to-one correspondence with the CPUs 210.

The input/output interface 230 may support interfacing between the CPUs 210 and the memory blades 400 through the interconnect blade 300 of FIG. 4. The input/output interface 230 may use protocols related to one or more wired communication technologies, output and transfer data from the CPUs 210 to the interconnect blade 300, and receive data inputted from the interconnection blade 300 to the CPUs 210. For example, the input/output interface 230 may support communication between the CPUs 210 and the interconnect blade 300 using one or more of protocols such as PCIe (Peripheral Component Interconnect Express), QPI (QuickPath Interconnect), Ethernet, and the like.

Figure 6A:
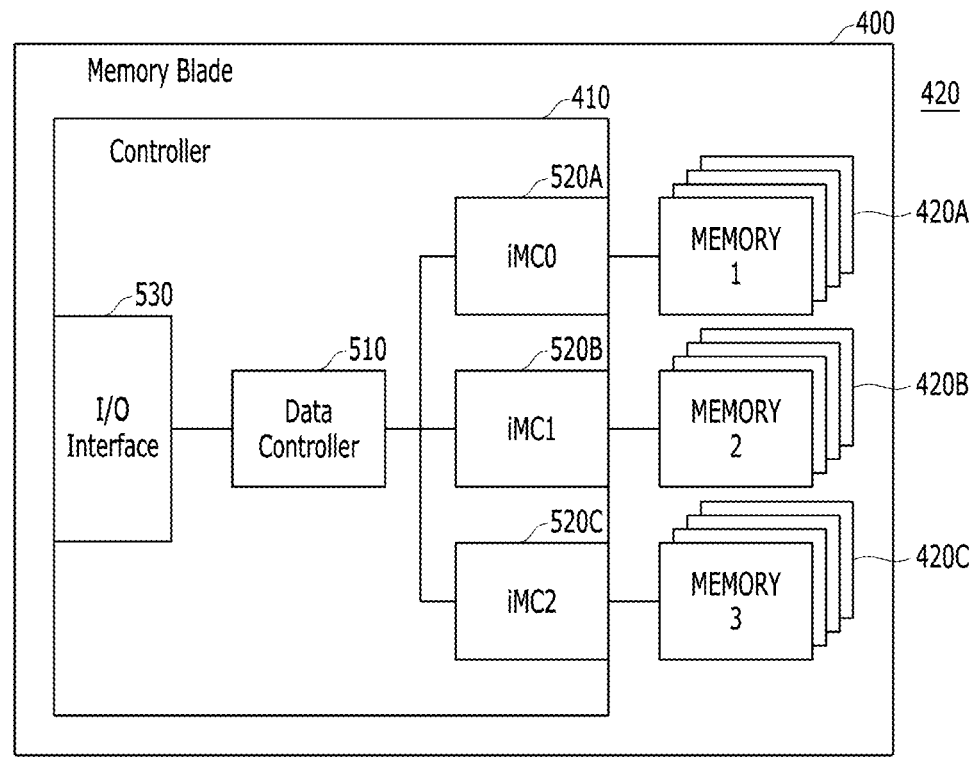
FIGS. 6A and 6B are block diagrams illustrating memory blades in accordance with embodiments of the present disclosure.
Figure 6B:
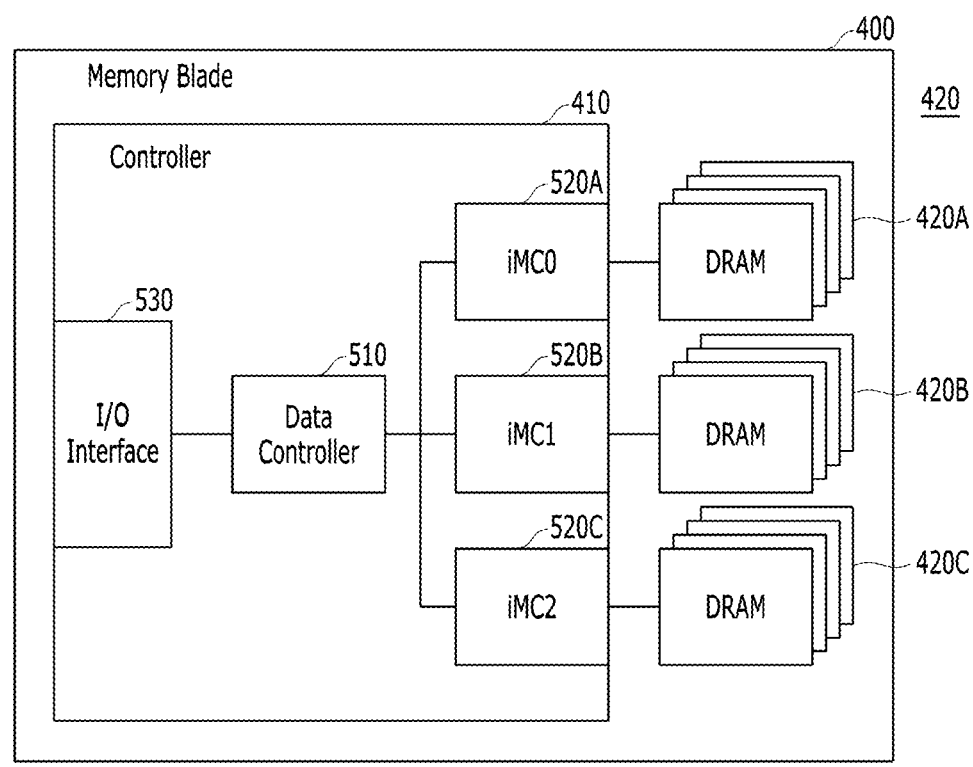

FIGS. 6A and 6B are block diagrams illustrating memory blades in accordance with embodiments of the present disclosure.

Referring to FIG. 6A, a memory blade 400 may include a controller 410 and a plurality of memories 420. The memories 420 may store (or write) data therein and output (or read out) stored data under the control of the controller 410. The memories 420 may include a first memory group 420A, a second memory group 420B, and a third memory group 420C. Each of the first, second, and third memory groups 420A, 420B, and 420C may include a multiplicity of memories. The first memory group 420A, the second memory group 420B, and the third memory group 420C may have the same characteristics or different characteristics. According to various embodiments of the present disclosure, the first memory group 420A, the second memory group 420B, and the third memory group 420C may include memories having the same characteristics in terms of storage capacity or latency, or memories having different characteristics.

Referring to FIG. 6B, each of the first memory group 420A, the second memory group 420B, and the third memory group 420C may include Dynamic Random Access Memories (DRAMs).

Referring back to FIG. 6A, the controller 410 may include a data controller 510, memory controllers MC 520A to 520C, and an input/output (I/O) interface 530.

The data controller 510 may control data that are transferred/received between the memories 420 and the compute blades 200 of FIG. 4. For example, in response to a write request or command, the data controller 510 may receive data for a write operation from the compute blades 200, and control the write operation for writing the data in a corresponding memory among the memories 420. In a read operation, in response to a read request or command, the data controller 510 may read out data stored in a particular memory among the memories 420 and control the read operation for outputting the read data to a corresponding compute blade among the compute blades 200.

The memory controllers MC 520A to 520C may be disposed between the data controller 510 and the memories 420, and support interfacing between the data controller 510 and the memories 420. The memory controllers MC 520A to 520C may include a first memory controller iMC0 520A, a second memory controller iMC1 520B, and a third memory controller iMC2 520C that respectively correspond to the first memory group 420A, the second memory group 420B, and the third memory group 420C that are included in the memories 420. The first memory controller iMC0 520A may be disposed between the data controller 510 and the first memory group 420A and support a data transfer/reception between the data controller 510 and the first memory group 420A. The second memory controller iMC1 520B may be disposed between the data controller 510 and the second memory group 420B and support a data transfer/reception between the data controller 510 and the second memory group 420B. The third memory controller iMC2 520C may be disposed between the data controller 510 and the third memory group 420C and support a data transfer/reception between the data controller 510 and the third memory group 420C. Herein, although a case where the controller 410 includes three memory controllers, i.e., the first memory controller iMC0 520A, the second memory controller iMC1 520B, and the third memory controller iMC2 520C is illustrated, when the first memory group 420A, the second memory group 420B, and the third memory group 420C include Dynamic Random Access Memories (DRAMs) as illustrated in FIG. 6B, the controller 410 may include a single memory controller.

The input/output interface 530 may support interfacing between the data controller 510 and the compute blades 200 through the interconnect blade 300 of FIG. 4. The input/output interface 530 may use one or more protocols related to wired communication technologies, transfer read data from the data controller 510 to the interconnect blade 300, and transfer write data from the interconnect blade 300 to the data controller 510. For example, the input/output interface 530 may support communication between the data controller 510 and the interconnect blade 300 based on one or more of protocols such as Peripheral Component Interconnect Express (PCIe), QuickPath Interconnect (QPI), Ethernet, and the like.

Hereinafter, utilization of a reserved memory cell, which is not in use among redundancy memory cells, will be described with reference to FIGS. 7 to 11.

Figure 7:
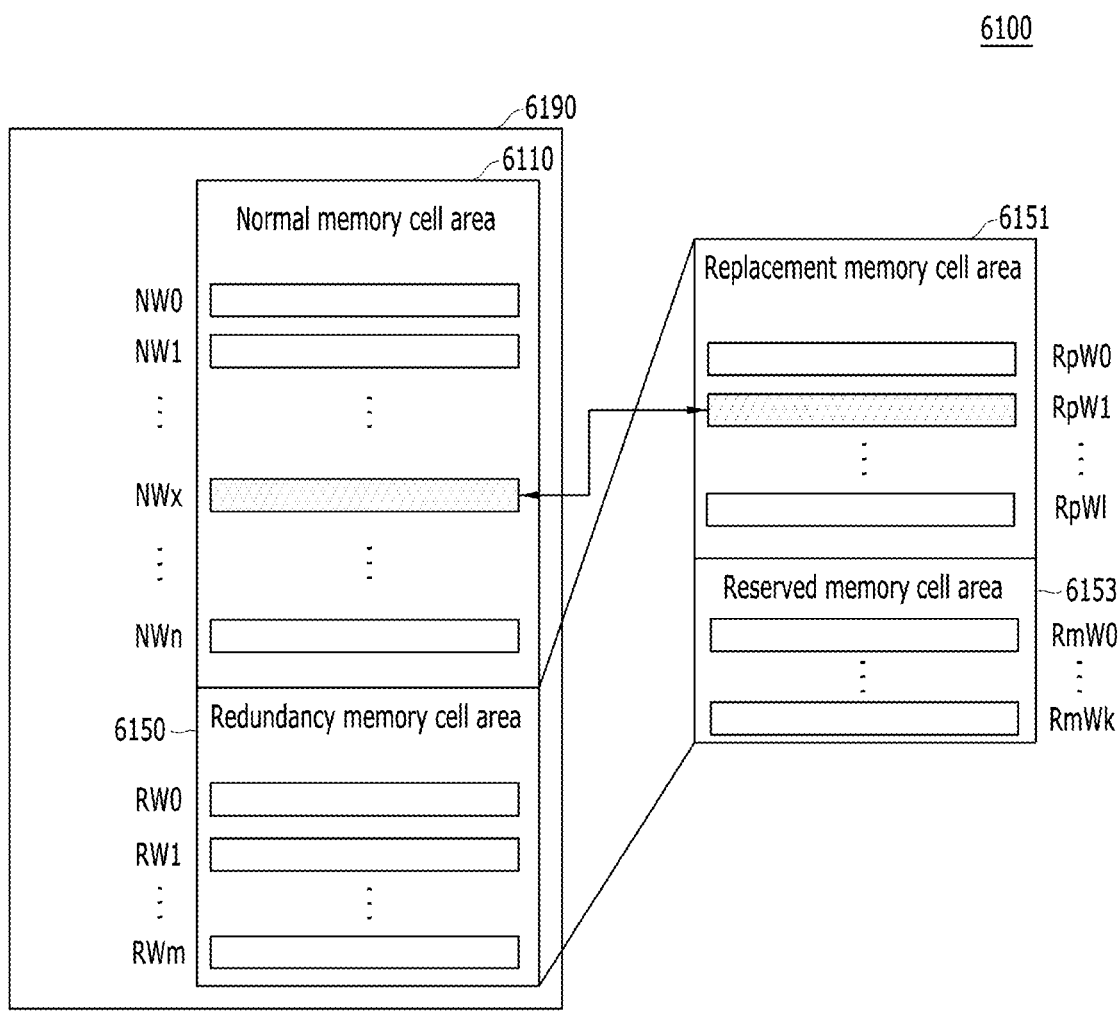
FIG. 7 is a schematic diagram illustrating a memory cell array of a memory device in accordance with an embodiment of the present disclosure.

FIG. 7 is a schematic diagram illustrating a structure of the memory device 6100. The memory device 6100 may correspond to the memory device 6050 shown in FIG. 1 or the plurality of memories 420 shown in FIGS. 6A and 6B.

The memory device 6100 may include a memory cell array 6190. The memory cell array 6190 may be divided into a normal memory cell area 6110 and a redundancy memory cell area 6150. A plurality of normal memory cells may be included in the normal memory cell area 6110. The plurality of normal memory cells may be coupled to a plurality of normal word lines NW0 to NWn, n being a positive integer. When one of the plurality of normal word lines NW0 to NWn is activated, data may be written into or read out from a multiplicity of normal memory cells coupled to the activated normal word line.

A plurality of redundancy memory cells may be included in the redundancy memory cell area 6150. The plurality of redundancy memory cells may be coupled to a plurality of redundancy word lines RW0 to RWm, m being a positive integer. When one of the plurality of redundancy word lines RW0 to RWm is activated, data may be written into or read out from a multiplicity of redundancy memory cells coupled to the activated redundancy word line.

The redundancy memory cell area 6150 may be divided into a replacement memory cell region 6151 and a reserved memory cell region 6153. A plurality of replacement memory cells may be included in the replacement memory cell region 6151. The plurality of replacement memory cells may be coupled to a plurality of replacement word lines RpW0 to RpWl, l being a positive integer. The plurality of replacement memory cells may replace a corresponding number of failed normal memory cells. For example, when a replacement target memory cell or a failed memory cell, which is coupled to the normal word line NWx, is detected in the normal memory cell area 6110, the normal word line NWx coupled to the replacement target memory cell may be replaced by a replacement word line, e.g., the replacement word line RpW1, in the replacement memory cell region 6151. A word line replacement operation of the memory system will be described in detail with reference to FIG. 8.

A plurality of reserved memory cells may be included in the reserved memory cell region 6153. The plurality of reserved memory cells may be coupled to a plurality of reserved word lines RmW0 to RmWk, k being a positive integer. The plurality of reserved memory cells of the reserved memory cell region 6153 are not used for replacing failed memory cells, and thus they may be wasted. That is, in the redundancy memory cell area 6150, the remaining region other than the replacement memory cell region 6151 in which the plurality of replacement memory cells are replaced with failed memory cells in the normal memory cell area 6110 may be the reserved memory cell region 6153. Therefore, the size of the reserved memory cell region 6153 may be determined depending on a number of failed memory cells in the normal memory cell area 6110. For example, when it is assumed that the redundancy memory cell area 6150 occupies 3% of the memory cell array 6190 1% of the memory cell array 6190 is assigned as the replacement memory cell region 6151 including the plurality of replacement memory cells that are replaced with failed memory cells, 2% of the memory cell array 6190 remains as the reserved memory cell region 6153. The reserved memory cell region 6153 may be wasted. However, in accordance with an embodiment of the present disclosure, the reserved memory cell region 6153 may be utilized without being wasted.

Figure 8:
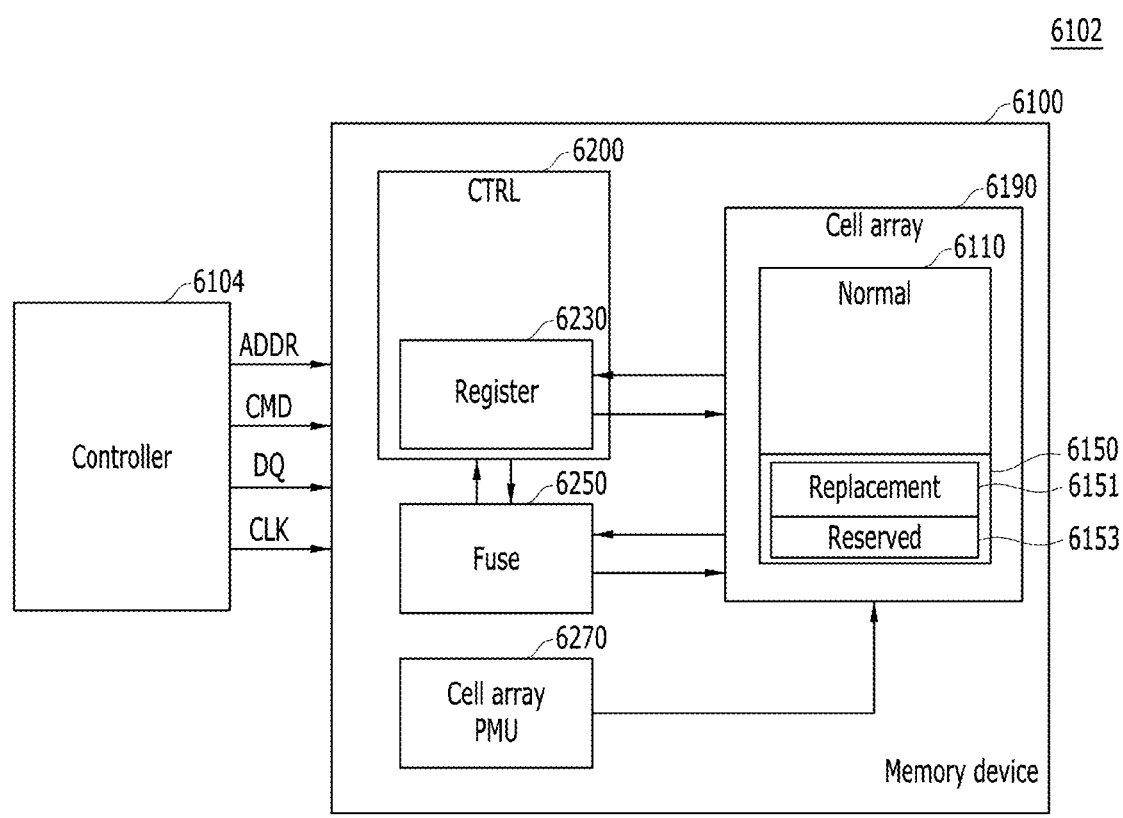
FIG. 8 is a block diagram schematically illustrating a memory system in accordance with an embodiment of the present disclosure.

FIG. 8 is a block diagram schematically illustrating the memory system 6102. The memory system 6102 may correspond to the memory system 110 shown in FIG. 1 or the memory blade 400 shown in FIGS. 6A and 6B in accordance with an embodiment of the present disclosure.

Referring to FIG. 8, the memory system 6102 includes the controller 6104 and the memory device 6100. The controller 6104 may control the memory device 6100 by providing the memory device 6100 with an address ADDR, a command CMD, a DQ signal DQ, and a dock signal CLK. The controller 6104 may correspond to the controller 6030 shown in FIG. 1 or the controller 410 shown in FIGS. 6A and 6B.

The memory device 6100 may include a memory device controller 6200, a fuse unit 6250, a cell array power management unit (PMU) 6270, and the memory cell array 6190 shown in FIG. 7. The memory device controller 6200 may include a register 6230 and may communicate with each of the fuse unit 6250, the cell array power management unit 6270, and the memory cell array 6190.

The register 6230 may identify the redundancy memory cell area 6150 of the memory cell array 6190. The register 6230 may identify each of the replacement memory cell region 6151 and the reserved memory cell region 6153 in the redundancy memory cell area 6150. The register 6230 may first identify the redundancy memory cell area 6150 and may generate a first signal indicating existence of the redundancy memory cell area 6150. In order to activate a plurality of redundancy memory cells, the register 6230 may re-set Mode Register Set (MRS) commands or may generate addresses for accessing the plurality of redundancy memory cells by activating internal circuits of the memory device 6100.

The MRS commands may include commands for setting operations of the memory device 6100 and commands for performing a read operation, a write operation, and a charging operation of the memory device 6100.

Further, the register 6230 may activate the fuse unit 6250 to generate address combination for activating the plurality of redundancy memory cells, using addresses provided to the memory device 6100. The register 6230 may provide the first signal to the controller 6104. The controller 6104 may assign addresses for the plurality of redundancy memory cells included in the redundancy memory cell area 6150 based on the first signal.

The register 6230 may generate a second signal for accessing the reserved memory cell region 6153. The register 6230 may first identify the reserved memory cell region 6153 and may generate the second signal indicating existence of the reserved memory cell region 6153. In order to activate a plurality of reserved memory cells in the reserved memory cell region 6153, the register 6230 may re-set the Mode Register Set (MRS) commands or may generate addresses for accessing the plurality of reserved memory cells by activating the internal circuits of the memory device 6100. Further, the register 6230 may activate the fuse unit 6250 to generate address combination for activating the plurality of reserved memory cells, using addresses provided to the memory device 6100. The register 6230 may provide the second signal to the controller 6104. The controller 6104 may assign addresses for the plurality of reserved memory cells included in the reserved memory cell region 6153 based on the second signal.

The fuse unit 6250 may receive the first and second signals, addresses transferred from the controller 6104, and activation signals for activating the plurality of redundancy memory cells and the plurality of reserved memory cells from the register 6230. The fuse unit 6250 may activate the plurality of redundancy memory cells included in the redundancy memory cell area 6150, and particularly, may activate the plurality of reserved memory cells included in the reserved memory cell region 6153 and the plurality of reserved word lines RmW0 to RmWk coupled to the plurality of reserved memory cells, based on the first and second signals, the addresses transferred from the controller 6104, and the activation signals for activating the plurality of redundancy memory cells and the plurality of reserved memory cells.

The memory cell array power management unit 6270 may separately manage power of the normal memory cell area 6110 and power of the redundancy memory cell area 6150 based on control signals provided from the memory device controller 6200. Particularly, the memory cell array power management unit 6270 may separately manage power of the reserved memory cell region 6153. Therefore, the memory cell array power management unit 6270 may turn off the power of the reserved memory cell region 6153 during an operation for a request, which does not use the plurality of reserved memory cells.

Figure 9:
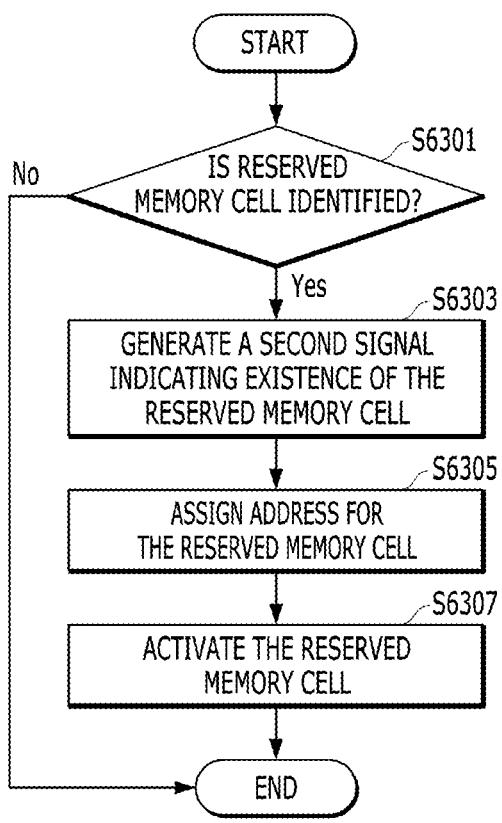
FIG. 9 is a flowchart schematically illustrating an operation of a memory system in accordance with an embodiment of the present disclosure.

FIG. 9 is a flowchart schematically illustrating an operation of the memory system 6102 shown in FIG. 8 in accordance with an embodiment of the present disclosure. FIG. 9 shows an operation of utilizing the plurality of reserved memory cells included in the reserved memory cell region 6153. The operation shown in FIG. 9 will be described with reference to FIG. 8.

At step S6301, the register 6230 may identify the reserved memory cell region 6153 as well as the redundancy memory cell area 6150. The size of the reserved memory cell region 6153 may be changed according to a type of the memory system 6102.

When the memory device 6100 does not include a reserved memory cell region, i.e., the reserved memory cell region is not identified ("No" at step S6301), the memory system 6102 may terminate a process without performing any particular operation relating to the reserved memory cell region.

When the reserved memory cell region 6153 is identified ("Yes" at step S6301), the memory system 6102 may perform an operation for utilizing the reserved memory cell region 6153.

When the register 6230 identifies the reserved memory cell region 6153, at step S6303, the register 6230 may generate the second signal indicating existence of the reserved memory cell region 6153.

As described above, the second signal may be provided to fuse unit 6250. Also, the second signal may be provided to the controller 6104.

At step S6305, the controller 6104 may assign addresses for accessing the plurality of reserved memory cells included in the reserved memory cell region 6153 based on the second signal, and may provide the generated addresses to the memory device 6100.

At step S6307, the fuse unit 6250 may activate the plurality of reserved memory cells included in the reserved memory cell region 6153 based on the activation signals provided from the register 6230 and the addresses provided from the controller 6104. The activated plurality of reserved memory cells can be used for a particular operation of the memory system 6102.

Accordingly, the controller 6104 may use all of the normal memory cell area 6110, the replacement memory cell region 6151, and the reserved memory cell region 6153 as a memory space of the memory device 6100.

Figure 10:
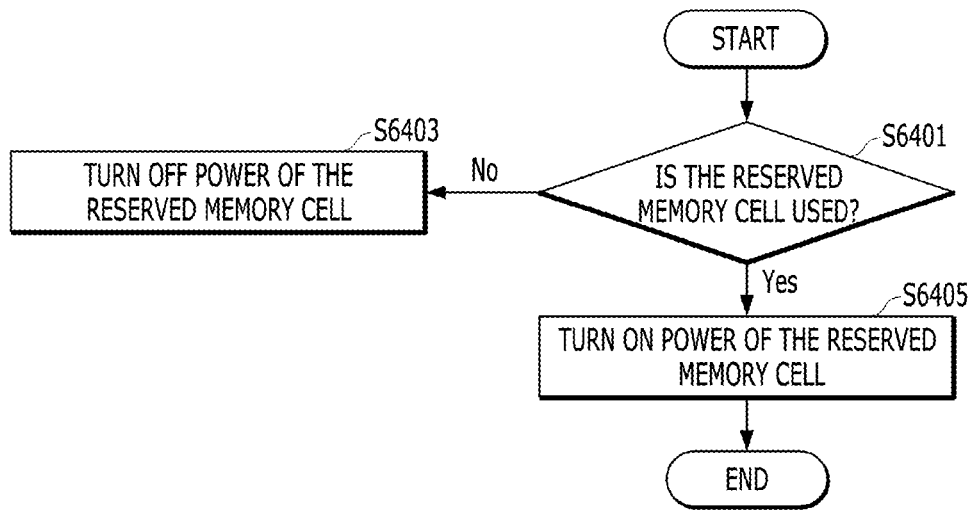
FIG. 10 is a flowchart schematically illustrating an operation of a memory system in accordance with an embodiment of the present disclosure.

FIG. 10 is a flowchart schematically illustrating an operation of the memory system 6102 shown in FIG. 8 in accordance with another embodiment of the present disclosure. FIG. 10 shows an operation of processing a request according to whether the request utilizes the plurality of reserved memory cells included in the reserved memory cell region 6153 or not. The operation shown in FIG. 10 will be described with reference to FIG. 8.

At step S6401, the controller 6104 may analyze a request provided from an external device, e.g., the host 102 shown in FIG. 1. The controller 6104 may determine whether the request uses the reserved memory cell region 6153 in the memory device 6100.

When the request does not use the reserved memory cell region 6153 ("No" at step S6401), the memory cell array power management unit 6270 may turn off power of the reserved memory cell region 6153 under the control of the controller 6104 at step S6403.

When it is determined that the request uses the reserved memory cell region 6153 ("Yes" at step S6401), the memory cell array power management unit 6270 may turn on the power of the reserved memory cell region 6153 under the control of the controller 6104 at step S6405.

Figure 11:
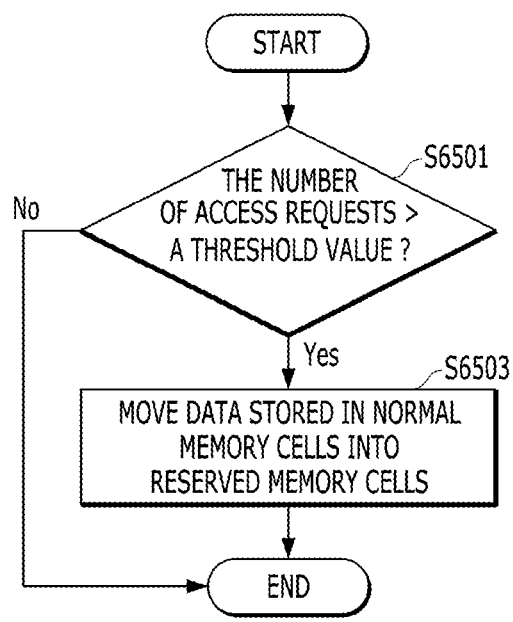
FIG. 11 is a flowchart schematically illustrating an operation of a memory system in accordance with an embodiment of the present disclosure.

FIG. 11 is a flowchart schematically illustrating an operation of the memory system 6102 shown in FIG. 8 in accordance with another embodiment of the present disclosure. FIG. 11 shows an operation of overcoming the row hammering. The row hammering may occur on a neighboring word line of a particular word line when a request processing operation is repeatedly performed to the particular word line.

At step S6501, the controller 6104 may count the number of access requests activating each of the plurality of word lines included in the memory device 6100. Particularly, the controller 6104 may count the number of access requests activating each of the plurality of normal word lines NW0 to NWn in the normal memory cell area 6110, and may detect a word line corresponding to the number of access requests that is greater than a predetermined threshold value, among the plurality of normal word lines NW0 to NWn in the normal memory cell area 6110.

When there is no word line, corresponding to the number of access requests that is greater than the predetermined threshold value, among the plurality of normal word lines NW0 to NWn in the normal memory cell area 6110 ("No" at step S6501), the memory system 6102 may terminate the process.

When there is detected a word line, corresponding to the number of access requests that is greater than the predetermined threshold value, among the plurality of normal word lines NW0 to NWn in the normal memory cell region 6110 ("Yes" at step S6501), the controller 6104 may control the memory device 6100 to move data stored in a multiplicity of normal memory cells coupled to the detected word line into a multiplicity of reserved memory cells coupled to a word line selected from the plurality of reserved word lines RmW0 to RmWk in the reserved memory cell region 6153. The controller 6104 may control the memory device 6100 to copy the data stored in the multiplicity of normal memory cells coupled to the detected word line into the multiplicity of reserved memory cells coupled to the selected reserved word line, and may assign addresses for accessing the multiplicity of reserved memory cells coupled to the selected reserved word line.

As described above, the controller 6104 of the memory system 6102 may improve the reliability issue such as the row hammering by using the reserved memory cell region 6153. That is, in the memory system 6102, word lines in the normal memory cell area 6110 are monitored before a problem occurs by the row hammering, an address for activating a first word line on which the problem may occur due to the row hammering is replaced with an address for activating a second word line in the reserved memory cell region 6153, and data stored in normal memory cells coupled to the first word line is copied and moved to reserved memory cells coupled to the second word line. The reserved memory cells are used to prevent the row hammering from occurring in the memory system 6102.

Although not illustrated, the memory system 6102 in accordance with an embodiment of the present disclosure may include a plurality of memory devices. Each of the plurality of memory devices may correspond to the memory device 6100 shown in FIG. 8. The controller 6104 may control each of the plurality of memory devices.

In accordance with the various embodiments of the present disclosure, a memory space recognized as substantial may be increased by replacing failed memory cells in the normal memory cell area 6110 with redundancy memory cells in the redundancy memory cell area 6150 and by identifying the reserved memory cell region 6153 of the redundancy memory cell region 6150 and using the reserved memory cell region 6153 for other usage. Also, in accordance with the various embodiments of the present disclosure, characteristics of the memory system 6102 may be improved by increasing an amount of memory cells practically used. That is, when the capacity of a memory assigned for processing a request is insufficient, the controller 6104 may additionally assign a plurality of reserved memory cells to process the request. Further, in accordance with the various embodiments of the present disclosure, the reliability of the memory system 6102 may be improved by using the reserved memory cell region 6153 to remove a reliability issue such as the row hammering.

Hereinafter, improvement of system performance by dynamically operating allocated memories according to a request will be described with reference to FIGS. 12A to 21D.

As described above, a data processing system or a server system may have a structure in which a plurality of blades, e.g., compute blades and memory or storage blades, are discriminatively installed in a unit rack. Herein, one memory blade may be a converged memory device or a pooled memory in which the same or different memories are converged according to required characteristics. For example, a memory blade requiring fast data processing may include a plurality of DRAMs. The following embodiments of the present disclosure suggest a method of allocating memories appropriate for a request in order to improve memory characteristics in terms of a speed and a power in a system including a converged memory device.

In other words, in a server system or a data processing system, a memory resource request occurs according to various applications or users' requirements, and memories are allocated appropriately according to the request. Therefore, memory devices should optimize functions and operation conditions for the memory allocation. In short, it is required to change and optimize characteristics of memories, such as a memory capacity, an operation rate, and power consumption. The following embodiments of the present disclosure suggest a method of dynamically operating memories included in a converged memory device as a fast memory or a normal memory according to a request. For example, when the memories are Dynamic Random Access Memories (DRAMs), memory cells included in the DRAMs may operate dynamically by being classified into fast memory cells or normal memory cells. An operation of classifying the memory cells into fast memory cells or normal memory cells may be performed by controlling bit lines using switching devices. According to various embodiments of the present disclosure, the switching devices may be disposed appropriately in the memories according to a required operation rate and power consumption. In addition, cloning cells may be used. According to various embodiments of the present disclosure, it is possible to efficiently cope with various applications by dynamically operating the memories included in the converged memory device as fast memories or normal memories. Also, embodiments of the present disclosure may improve an operation rate and power consumption of the converged memory device. Also, embodiments of the present disclosure may improve system performance by dynamically operating allocated memories according to a request, rather than by allocating new memories.

Figure 12A:
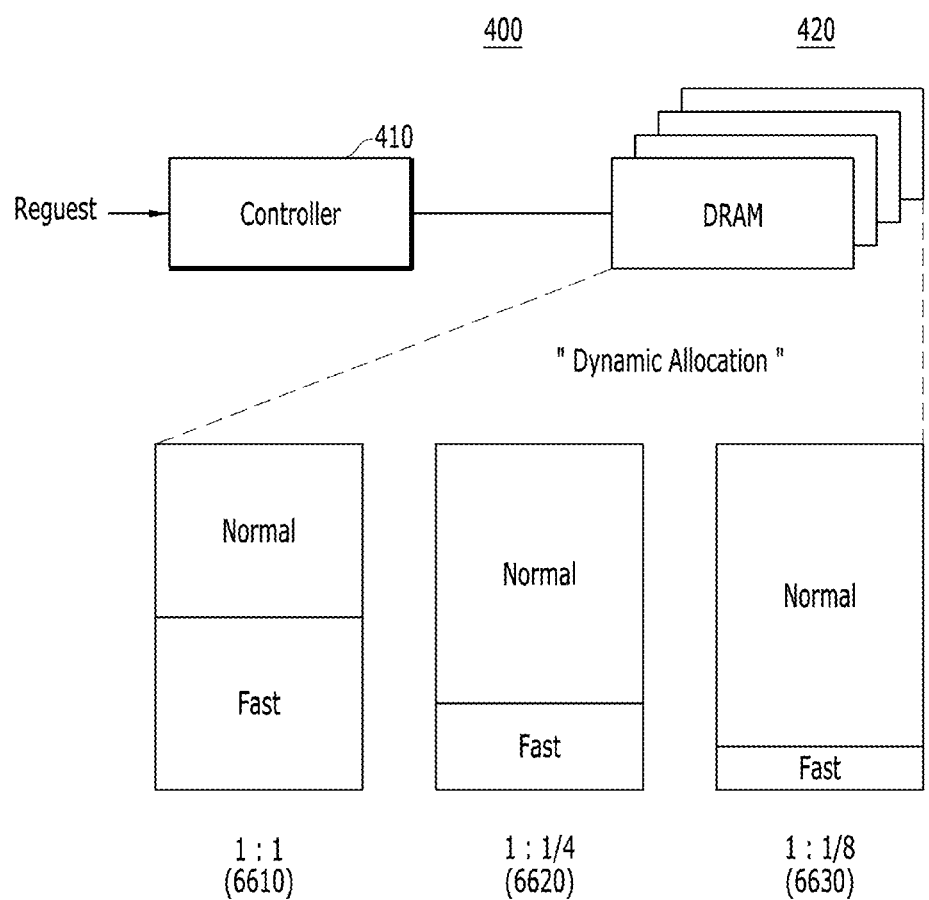
FIG. 12A illustrates a memory blade including a controller in accordance with an embodiment of the present disclosure.

FIG. 12A illustrates a memory blade including a controller in accordance with an embodiment of the present disclosure.

Referring to FIG. 12A, a memory blade 400 may include a controller 410 and memories 420. According to various embodiments of the present disclosure, each of the memories 420 may be a DRAM. The controller 410 may receive a request from one compute blade among the compute blades 200 illustrated in FIG. 4, select a memory from the memories 420, and allocate the selected memory to process the received request. The controller 410 may allocate the memories 420 in order to improve a processing rate of the DRAMs and to reduce power consumption. The power consumption includes power consumption during a refresh operation of the DRAMs.

According to various embodiments of the present disclosure, the controller 410 may select and allocate some of DRAMs among the memories 420 as fast DRAMs for processing data at a high speed, and select and allocate the other DRAMs among the memories 420 as normal DRAMs for processing data at a normal speed. In an embodiment, the controller 410 may allocate the DRAMs 420 so that the number of normal DRAMs and the number of fast DRAMs become the same in step 6610. For example, a ratio of the number of normal DRAMs to the number of fast DRAMs is 1:1 when step 6610 is complete. In another embodiment, the controller 410 may allocate the DRAMs 420 so that the number of normal DRAMs and the number of fast DRAMs are different. For example, in step 6620, the controller 410 may allocate the DRAMs 420 so that a ratio of the number of normal DRAMs to the number of fast DRAMs is 1:1/4, or in step 6630, the controller 410 may allocate the DRAMs 420 so that a ratio of the number of normal DRAMs to the number of fast DRAMs is 1:1/8. According to various embodiments of the present disclosure, the controller 410 may dynamically select and allocate fast DRAMs and normal DRAMs among the DRAMs 420 according to the received request. In other words, instead of allocating the DRAMs 420 into a fixed number of fast DRAMs and a fixed number of normal DRAMs, the controller 410 may allocate the DRAMs 420 in such a manner that the number of allocated fast DRAMs is increased when the received request requires fast processing and low power consumption. When the request is not received, or specifies other requirements, the controller 410 may allocate the DRAMs 420 in such a manner that the number of allocated fast DRAMs is decreased or becomes zero (0).

Figure 12B:
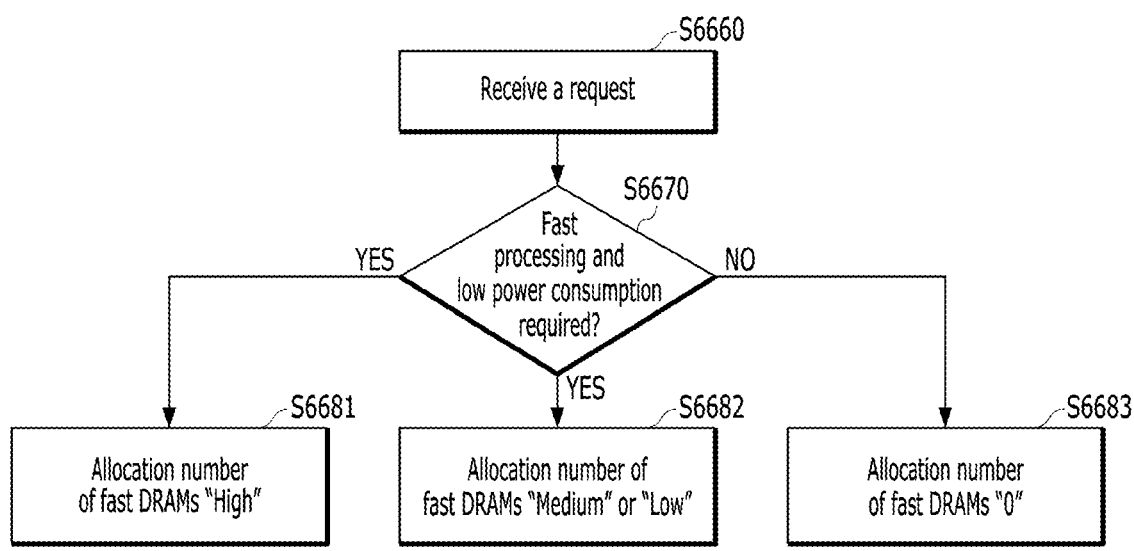
FIG. 12B is a flowchart illustrating performing an allocation operation of allocating a plurality of memories that are included in a memory blade by a controller in accordance with an embodiment of the present disclosure.

FIG. 12B is a flowchart illustrating an operation of allocating memories in a memory blade in accordance with an embodiment of the present disclosure. For example, the controller 410 illustrated in FIG. 12A may dynamically allocate the DRAMs 420 included in the memory blade 400 as fast DRAMs and normal DRAMs.

Referring to FIG. 12B, the controller 410 may receive a request in step S6660, and determine whether the received request requires fast processing and low power consumption or not in step S6670. According to various embodiments of the present disclosure, the request may be a request from a processing element included in one compute blade among the compute blades 200 illustrated in FIG. 4. In another embodiment, the request may be a request from a single host. Since the host may include a single compute blade or a plurality of compute blades, for the sake of convenience in description, the present disclosure will be described hereafter based on an assumption that the request is from the host.

When it is determined that the received request requires fast processing and low power consumption, the controller 410 may select and allocate fast DRAMs for processing the received request at a high speed among the DRAMs 420 in steps S6681 and S6682. According to required extents of fast processing and low power consumption, the controller 410 may allocate the fast DRAMs in such a manner that the number of fast DRAMs becomes 'high' in the step S6681, or allocate the fast DRAMs in such a manner that the number of fast DRAMs becomes 'medium' or 'low' in the step S6682.

When it is determined that the received request does not require fast processing and low power consumption, the controller 410 may select and allocate normal DRAMs for processing the received request among the DRAMs 420 in steps S6683. In other words, in this case, the controller 410 may not allocate fast DRAMs. Thus, the number of fast DRAMs allocated becomes zero (0).

As described above, FIG. 12B illustrates an embodiment in which the cases requiring fast data processing and low power consumption are divided into three cases of 'high,' 'medium,' and 'low.' The controller 410 allocates a different number of fast DRAMs in each of the three cases. However, embodiments are not limited thereto. The number of cases requiring fast data processing and low power consumption may be appropriately adjusted and the number of fast DRAMs allocated to each of the cases may be changed according to the number of cases, for example.

Figure 13A:
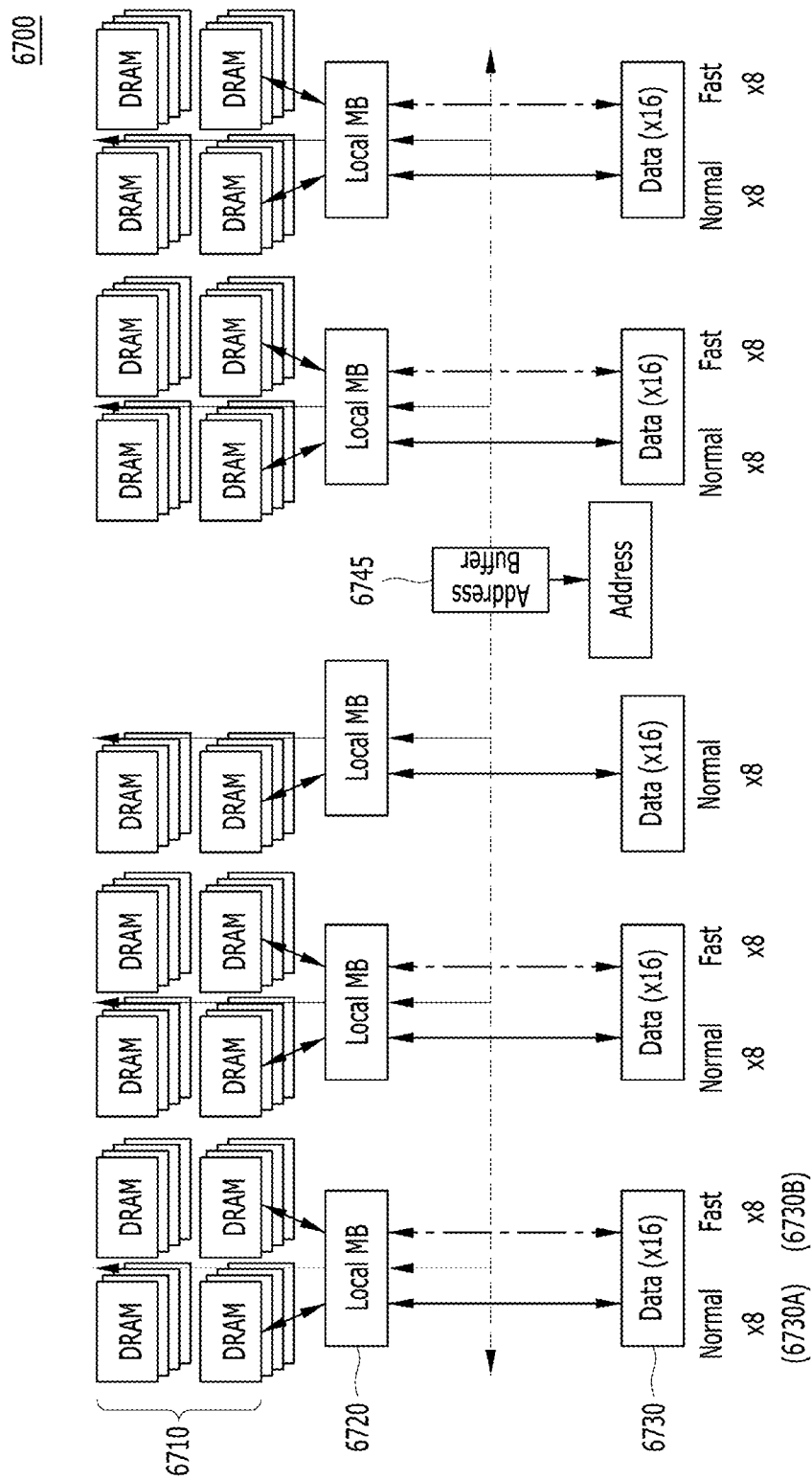
FIGS. 13A to 13C illustrate a memory blade that uses a portion of a plurality of memories for fast data processing and that uses the other portion of the memories for normal data processing in accordance with an embodiment of the present disclosure.
Figure 13B:
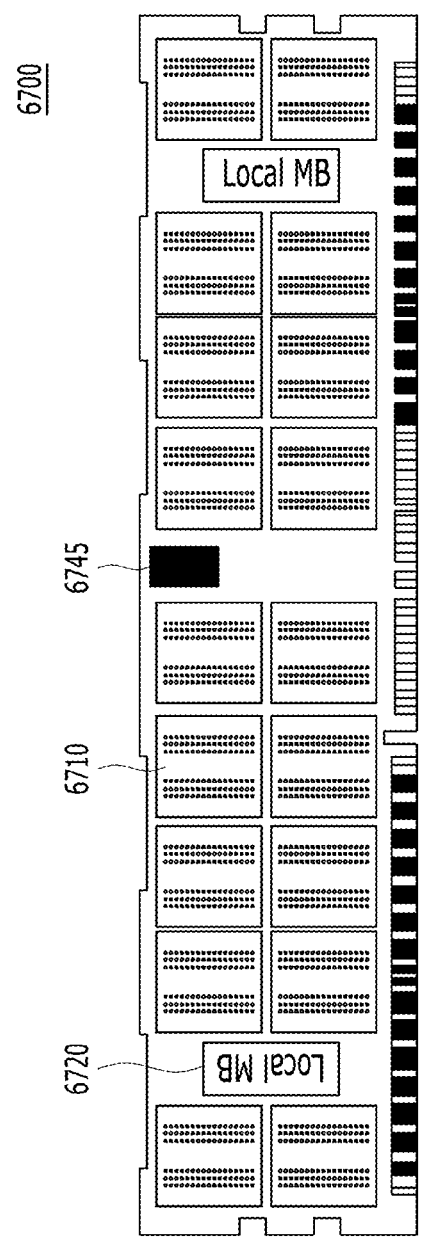
Figure 13C:
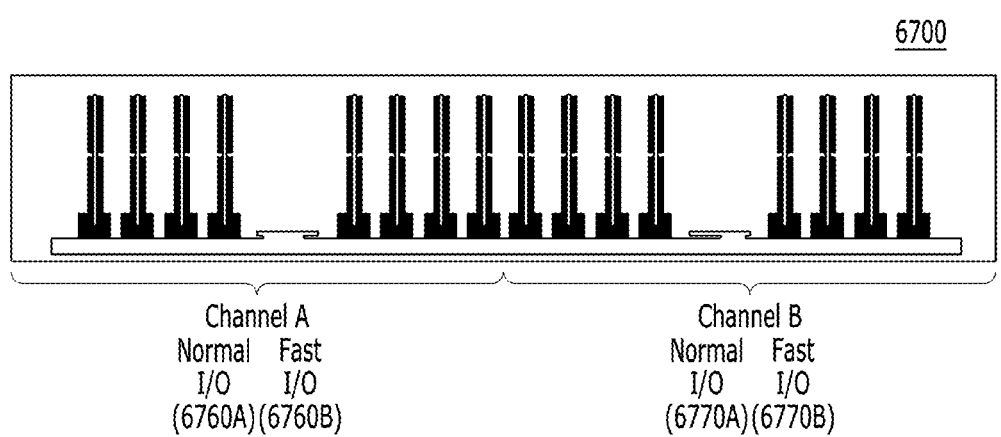

FIGS. 13A to 13C illustrate a memory blade 6700, which uses a first memory group of a plurality of memories for fast data processing and uses a second memory group of the plurality of memories for normal data processing, in accordance with an embodiment of the present disclosure. Although a structure in which the plurality of memories are included in one memory blade 6700 is used as an example herein, the plurality of memories may be included in one memory module, drawer, or rack unit in other examples of the present disclosure.

Referring to FIGS. 13A and 13B, the memory blade 6700 may include a plurality of DRAMs 6710. The DRAMs 6710 may be divided by a controller, e.g., the controller 410 in FIG. 12A, into normal DRAMs and fast DRAMs, as described above with reference to FIGS. 12A and 12B. Data 6730 may be divided into normal data 6730A and fast data 6730B. The normal data 6730A are transferred/received between a normal DRAM and a data path (not shown), and the fast data 6730B are transferred/received between a fast DRAM and the data path. In other words, the DRAMs 6710 may output normal data or fast data. The memory blade 6700 may further include a local memory buffer (MB) 6720 and an address buffer 6745. The local memory buffer 6720 temporarily stores data that are transferred/received between the DRAMs 6710 and the data path, and the address buffer 6745 stores an address to be applied to the local memory buffer 6720.

Referring to FIG. 13C, the memory blade 6700 may be combined with a host processor, e.g., the compute blade 200 of FIG. 4, through a plurality of channels, e.g., a channel A and a channel B. The channel A may include a path 6760A for normal data input/output (I/O) and a path 6760B for fast data input/output (I/O). Likewise, the channel B may include a path 6770A for normal data input/output (I/O) and a path 6770B for fast data input/output (I/O).

According to the embodiments of the present disclosure described above, DRAMs in a memory blade may dynamically perform normal data output or fast data output according to a request. Therefore, the embodiments of the present disclosure may be able to improve an operation rate and system performance by selecting and allocating appropriate DRAMs, which are appropriate for processing an urgent request that should be processed rapidly and that outputs fast data. Also, the embodiments of the present disclosure may be able to detect refresh characteristics of DRAMs and appropriately use them according to a request. DRAMs for outputting fast data may be selected and allocated by providing DRAMs with a bit line switching device and controlling the bit line switching device, which will be described below.

Figure 14A:
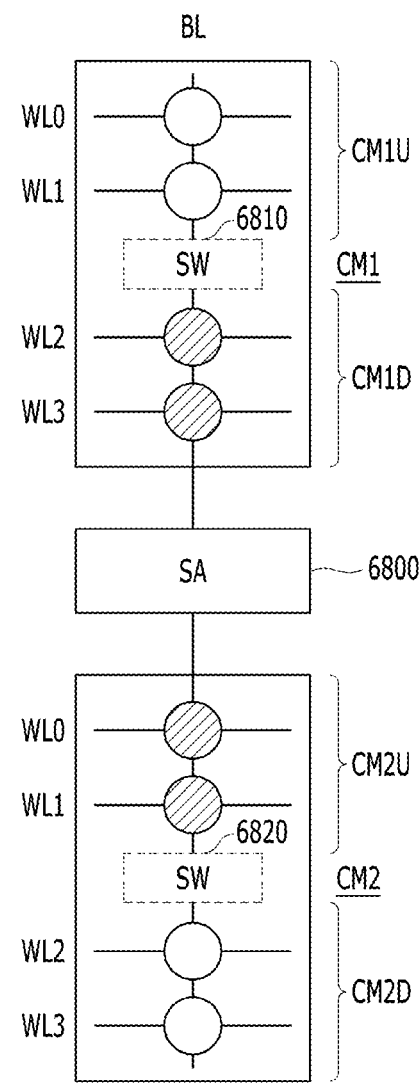
FIGS. 14A and 14B illustrate Dynamic Random Access Memories (DRAMs) that are used for fast data processing, among a plurality of memories, in accordance with embodiments of the present disclosure.
Figure 14B:
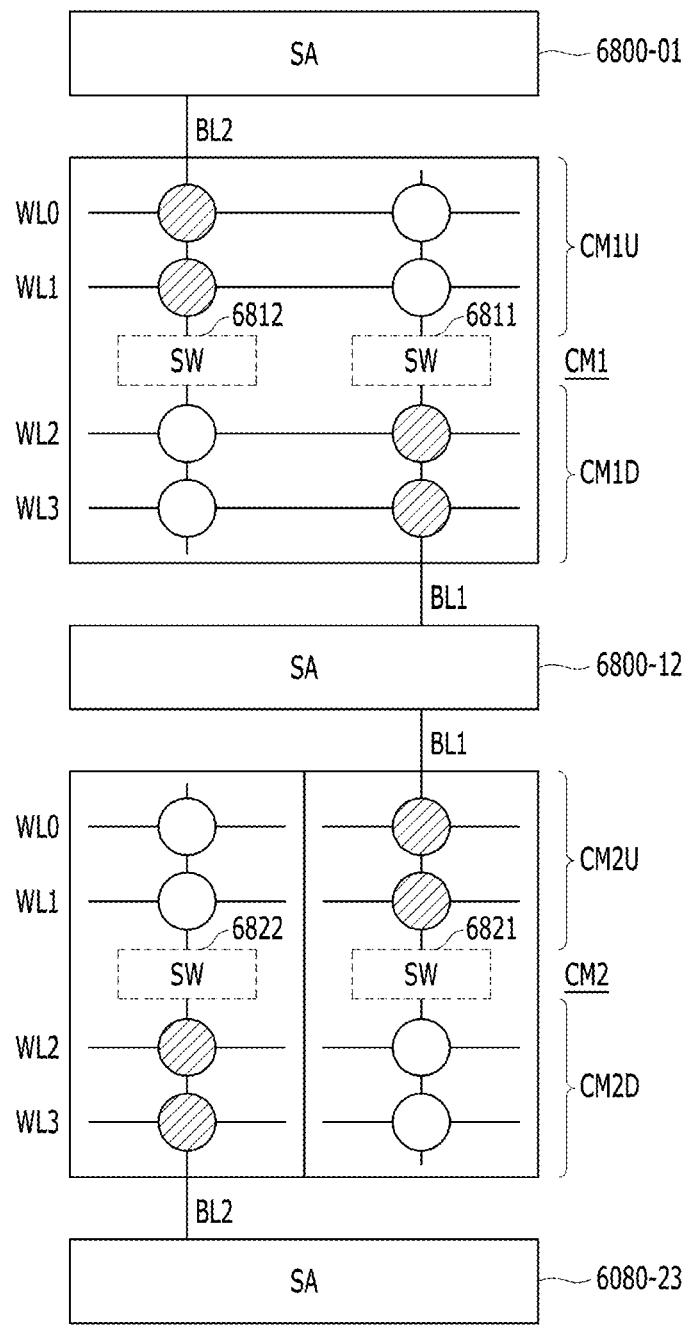

FIGS. 14A and 14B illustrate a Dynamic Random Access Memory (DRAM) that is used for fast data processing among a plurality of memories in accordance with embodiments of the present disclosure. For the sake of convenience in description, FIG. 14A illustrates a single bit line that is combined with a sense amplifier (SA) included in a DRAM. FIG. 14B illustrates a pair of bit lines that are combined with a sense amplifier (SA) in a DRAM, which has an asymmetric bit line architecture.

Referring to FIG. 14A, a DRAM may include a first cell matrix CM1, a second cell matrix CM2, and a sense amplifier (SA) 6800. The sense amplifier 6800 is disposed between the first cell matrix CM1 and the second cell matrix CM2. Memory cells of the first cell matrix CM1, the sense amplifier 6800, and memory cells of the second cell matrix CM2 may be coupled to a single bit line BL.

In the first cell matrix CM1, the memory cells are coupled between the bit line BL and a plurality of word lines WL0 to WL3, respectively. The memory cells included in the first cell matrix CM1 may be divided into lower memory cells CM1D and upper memory cells CM1U. The lower memory cells CM1D are disposed at positions that are less than a first distance from the sense amplifier 6800 and are relatively close to the sense amplifier 6800, and the upper memory cells CM1U are disposed at positions that are more than a second distance from the sense amplifier 6800 and are relatively far from the sense amplifier 6800. The second distance is longer than the first distance. A switching device SW 6810 may be disposed between the upper memory cells CM1U and the lower memory cells CM1D. The switching device SW 6810 may be turned on or off by the controller 410 shown in FIG. 12A.

When the switching device SW 6810 is turned on, the upper memory cells CM1U and the lower memory cells CM1D are coupled to each other, and the memory cells CM1U and CM1D of the first cell matrix CM1 may operate as normal memory cells. On the other hand, when the switching device SW 6810 is turned off, the upper memory cells CM1U are cut off from the lower memory cells CM1D, and the first cell matrix CM1 may operate as fast memory cells. When the upper memory cells CM1U are cut off from the lower memory cells CM1D, the bit line BL may not bear any load from the upper memory cells CM1U. Therefore, a data processing rate for the lower memory cells CM1D may increase and an operation current or power consumption of the first cell matrix CM1 may be reduced. As a result, when the switching device SW 6810 is turned off, the first cell matrix CM1 may be able to operate as fast memory cells.

In the second cell matrix CM2, the memory cells are coupled between the bit line BL and the word lines WL0 to WL3, respectively. The memory cells in the second cell matrix CM2 may be divided into lower memory cells CM2D and upper memory cells CM2U. The lower memory cells CM2D are disposed at positions that are more than the second distance from the sense amplifier 6800 and are relatively far from the sense amplifier 6800. The upper memory cells CM2U are disposed at positions that are less than the first distance from the sense amplifier 6800 and are relatively close to the sense amplifier 6800. A switching device SW 6820 may be disposed between the upper memory cells CM2U and the lower memory cells CM2D. The switching device SW 6820 may be turned on or off by the controller 410 shown in FIG. 12A.

When the switching device SW 6820 is turned on, the upper memory cells CM2U and the lower memory cells CM2D are coupled to each other, and the memory cells CM2U and CM2D of the second cell matrix CM2 may operate as normal memory cells. On the other hand, when the switching device SW 6820 is turned off, the lower memory cells CM2D are cut off from the upper memory cells CM2U, and the second cell matrix CM2 may operate as fast memory cells. When the lower memory cells CM2D are cut off from the upper memory cells CM2U, the bit line BL may not bear any load from the lower memory cells CM2D. Therefore, a data processing rate for the upper memory cells CM2U may increase and an operation current or power consumption of the second cell matrix CM2 may be reduced. As a result, when the switching device SW 6820 is turned off, the second cell matrix CM2 may be able to operate as fast memory cells.

Referring to FIG. 14B, a DRAM may include a first cell matrix CM1, a second cell matrix CM2, a sense amplifier (SA) 6800-12 that is disposed between the first cell matrix CM1 and the second cell matrix CM2, a sense amplifier (SA) 6800-01 that is disposed over the first cell matrix CM1, and a sense amplifier (SA) 6800-23 that is disposed below the second cell matrix CM2, with respect to the orientation illustrated in FIG. 14B. A portion of memory cells of the first cell matrix CM1, e.g., right-side memory cells, may be coupled to the sense amplifier 6800-12 through a bit line BL1. A portion of memory cells of the second cell matrix CM2, e.g., right-side memory cells, may be coupled to the sense amplifier 6800-12 through the bit line BL1. Another portion of the memory cells of the first cell matrix CM1, e.g., left-side memory cells, may be coupled to the sense amplifier 6800-01 through a bit line BL2. Another portion of the memory cells of the second cell matrix CM2, e.g., left-side memory cells, may be coupled to the sense amplifier 6800-23 through the bit line BL2. In a case of the sense amplifier 6800-12, the bit lines BL1 and BL2 may be a pair of bit lines BL and BLB (or/BL). In a case of the sense amplifier 6800-01, the bit lines BL2 and BL1 may be a pair of bit lines BL and BLB (or/BL). In a case of the sense amplifier 6800-23, the bit lines BL2 and BL1 may be a pair of bit lines BL and BLB (or/BL).

In the first cell matrix CM1, each of the right-side memory cells and each of the left-side memory cells are coupled between each of the word lines WL0 to WL3 and the bit line BL2.

The right-side memory cells of the first cell matrix CM1 that are coupled to the bit line BL1 may be divided into lower right-side memory cells CM1D and upper right-side memory cells CM1U. The lower right-side memory cells CM1D are disposed at positions that are less than a first distance from the sense amplifier 6800-12 and are relatively close to the sense amplifier 6800-12. The upper right-side memory cells CM1U are disposed at positions that are more than a second distance from the sense amplifier 6800-12 and are relatively far from the sense amplifier 6800-12. The second distance is longer than the first distance. A switching device SW 6811 may be disposed between the upper right-side memory cells CM1U and the lower right-side memory cells CM1D. The switching device SW 6811 may be turned on or off by the controller 410 shown in FIG. 12A.

When the switching device SW 6811 is turned on, the upper right-side memory cells CM1U and the lower right-side memory cells CM1D are coupled to each other. The right-side memory cells of the first cell matrix CM1 may operate as normal memory cells. On the other hand, when the switching device SW 6811 is turned off, the upper right-side memory cells CM1U are cut off from the lower right-side memory cells CM1D, and the right-side memory cells of the first cell matrix CM1 may operate as fast memory cells. When the upper right-side memory cells CM1U are cut off from the lower right-side memory cells CM1D, the bit line BL1 may not bear any load from the upper right-side memory cells CM1U. Therefore, a data processing rate for the lower right-side memory cells CM1D coupled to the bit line BL1 may increase, and an operation current or power consumption of the right-side memory cells of the first cell matrix CM1 may be reduced. As a result, when the switching device SW 6811 is turned off, the right-side memory cells of the first cell matrix CM1 that are coupled to the bit line BL1 may be able to operate as fast memory cells.

The left-side memory cells of the first cell matrix CM1 that are coupled to the bit line BL2 may be divided into upper left-side memory cells CM1U and lower left-side memory cells CM1D. The upper left-side memory cells CM1U are disposed at positions that are less than a third distance from the sense amplifier 6800-01 and are relatively close to the sense amplifier 6800-01, and the lower left-side memory cells CM1D are disposed at positions that are more than a fourth distance from the sense amplifier 6800-01 and are relatively far from the sense amplifier 6800-01. The fourth distance is longer than the third distance. A switching device SW 6812 may be disposed between the upper left-side memory cells CM1U and the lower left-side memory cells CM1D. The switching device SW 6812 may be turned on or off by the controller 410 shown in FIG. 12A.

When the switching device SW 6812 is turned on, the upper left-side memory cells CM1U and the lower left-side memory cells CM1D, which are coupled to the bit line BL2 and are coupled to each other, and the left-side memory cells of the first cell matrix CM1, which are coupled to the bit line BL2, may operate as normal memory cells. On the other hand, when the switching device SW 6812 is turned off, the lower left-side memory cells CM1D are cut off from the upper left-side memory cells CM1U, and the left-side memory cells of the first cell matrix CM1 may operate as fast memory cells. When the lower left-side memory cells CM1D are cut off from the upper left-side memory cells CM1U, the bit line BL2 may not bear any load from the lower left-side memory cells CM1D. Therefore, a data processing rate for the upper left-side memory cells CM1U may increase and an operation current or power consumption of the left-side memory cells of the first cell matrix CM1 may be reduced. As a result, when the switching device SW 6812 is turned off, the left-side memory cells of the first cell matrix CM1 may be able to operate as fast memory cells.

The right-side memory cells of the second cell matrix CM2 may be divided into upper right-side memory cells CM2U and lower right-side memory cells CM2D. The upper right-side memory cells CM2U are disposed at positions that are less than the first distance from the sense amplifier 6800-12, and are relatively close to the sense amplifier 6800-12. The lower right-side memory cells CM2D are disposed at positions that are more than the second distance from the sense amplifier 6800-12 and are relatively far from the sense amplifier 6800-12. A switching device SW 6821 may be disposed between the upper right-side memory cells CM2U and the lower right-side memory cells CM2D. The switching device SW 6821 may be turned on or off by the controller 410 shown in FIG. 12A.

When the switching device SW 6821 is turned on, the upper right-side memory cells CM2U and the lower right-side memory cells CM2D are coupled to each other, and the right-side memory cells of the second cell matrix CM2 may operate as normal memory cells. On the other hand, when the switching device SW 6821 is turned off, the lower right-side memory cells CM2D are cut off from the upper right-side memory cells CM2U, and the right-side memory cells of the second cell matrix CM2 may operate as fast memory cells. When the lower right-side memory cells CM2D are cut off from the upper right-side memory cells CM2U, the bit line BL1 may not bear any load from the lower right-side memory cells CM2D. Therefore, a data processing rate for the upper right-side memory cells CM2U may increase and an operation current or power consumption of the right-side memory cells of the second cell matrix CM2 may be reduced. As a result, when the switching device SW 6821 is turned off, the right-side memory cells of the second cell matrix CM2 may be able to operate as fast memory cells.

The left-side memory cells of the second cell matrix CM2 that are coupled to the bit line BL2 may be divided into lower left-side memory cells CM2D and upper left-side memory cells CM2U. The lower left-side memory cells CM2D are disposed at positions that are less than the third distance from the sense amplifier 6800-23 and are relatively close to the sense amplifier 6800-23. The upper left-side memory cells CM2U are disposed at positions that are more than the fourth distance from the sense amplifier 6800-23 and are relatively far from the sense amplifier 6800-23. A switching device SW 6822 may be disposed between the upper left-side memory cells CM2U and the lower left-side memory cells CM2D. The switching device SW 6822 may be turned on or off by the controller 410 shown in FIG. 12A.

When the switching device SW 6822 is turned on, the upper left-side memory cells CM2U and the lower left-side memory cells CM2D are coupled to each other, and the left-side memory cells of the second cell matrix CM2 may operate as normal memory cells. On the other hand, when the switching device SW 6822 is turned off, the upper left-side memory cells CM2U are cut off from the lower left-side memory cells CM2D, and the left-side memory cells of the second cell matrix CM2 may operate as fast memory cells. When the upper left-side memory cells CM2U are cut off from the lower left-side memory cells CM2D, the bit line BL2 may not bear any load from the upper left-side memory cells CM2U. Therefore, a data processing rate for the lower left-side memory cells CM2D may increase and an operation current or power consumption of the left-side memory cells of the second cell matrix CM2 may be reduced. As a result, when the switching device SW 6822 is turned off, the left-side memory cells of the second cell matrix CM2 may be able to operate as fast memory cells.

According to the embodiments of the present disclosure described above, a converged memory device may include a plurality of memories and a controller. At least one memory among the memories in the converged memory device may include a sense amplifier and at least one cell matrix. The cell matrix includes at least one first region memory cell, at least one first region memory cell, and a switching device. The first region memory cell is disposed at a position that is less than a first distance from the sense amplifier, and the second region memory cell is disposed at a position that is more than a second distance from the sense amplifier, the second distance being longer than the first distance. The switching device is disposed between the first region memory cell and the second region memory cell. The at least one memory may include a Dynamic Random Access Memory (DRAM).

A method for operating the converged memory device described above may include receiving a request from a host and controlling the switching device disposed between the first region memory cell and the second region memory cell in such a manner that the first region memory cell is coupled to the sense amplifier and the second region memory cell is selectively decoupled from the sense amplifier in response to the request.

In various embodiments of the present disclosure, the number of first region memory cells and the number of second region memory cells may be the same or different.

In various embodiments of the present disclosure, the method for operating the converged memory device may further include sequentially outputting data from the first region memory cell and data from the second region memory cell through a data path. The data from the first region memory cell may be outputted before the data from the second region memory cell is received.

In various embodiments of the present disclosure, the method for operating the converged memory device may further include migrating predetermined data among the data for the second region memory cell into the first region memory cell and cloning the migrated data; as well as accessing the cloned data in the first region memory cell when the predetermined data is requested.

In various embodiments of the present disclosure, the predetermined data may include frequently used data, which is also referred to as 'hot data.'

In various embodiments of the present disclosure, the request may include a request corresponding to fast processing or low power consumption.

Figure 15:
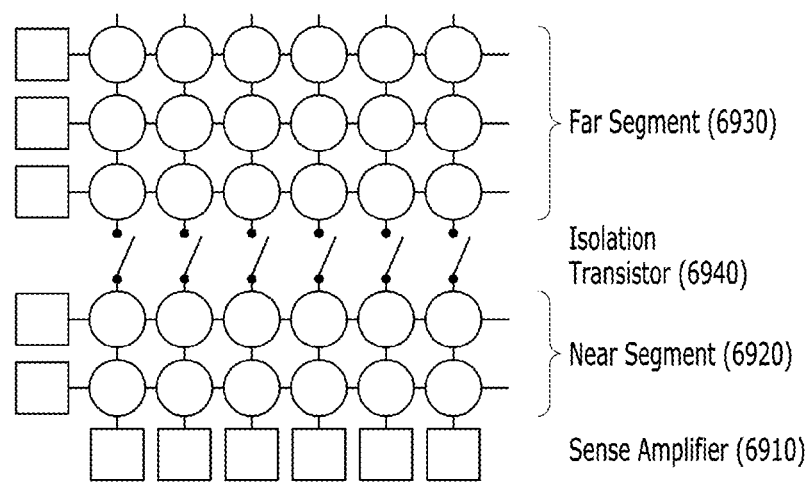
FIG. 15 illustrates a cell matrix including a switching device in accordance with an embodiment of the present disclosure.

FIG. 15 illustrates a cell matrix including a switching device in accordance with an embodiment of the present disclosure.

Referring to FIG. 15, the cell matrix may include near segment cells 920 and far segment cells 930. The near segment cells 920 are disposed relatively close to a sense amplifier 910, and the far segment cells 930 are disposed relatively far from the sense amplifier 910. Isolation transistors 940 may be disposed between the near segment cells 920 and the far segment cells 930. The isolation transistors 940 may be turned on or turned off by the controller 410, which is illustrated in FIG. 12A.

When the isolation transistors 940 are turned on, the far segment cells 930 and the near segment cells 920 are coupled to each other, and the cells in the cell matrix may operate as normal memory cells. When the isolation transistors 940 are turned off, the far segment cells 930 are cut off from the near segment cells 920 and the cells in the cell matrix may operate as fast memory cells.

The isolation transistors 940 may perform a turn-on or turn-off operation that couples or decouples the far segment cells 930 to or from the near segment cells 920. The isolation transistor 940 may be a constituent element within the switching devices 6810, 6811, 6812, 6820, 6821, and 6822 illustrated in FIGS. 14A and 14B.

Figure 16:
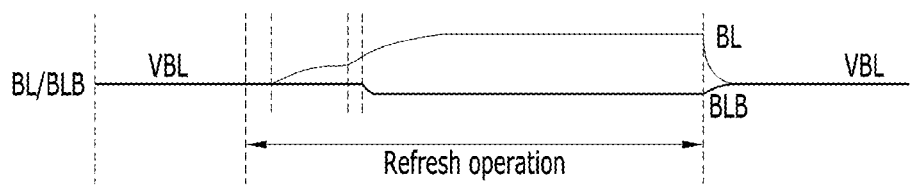
FIG. 16 illustrates a waveform of a refresh operation in a cell matrix having an asymmetrical bit line structure in accordance with an embodiment of the present disclosure.

FIG. 16 illustrates a waveform of an operation in a cell matrix having an asymmetrical bit line structure in accordance with an embodiment of the present disclosure. For example, FIG. 16 illustrates a waveform of a refresh operation corresponding to a case in which a cell matrix has an asymmetrical bit line structure as illustrated in FIG. 14B.

Referring to FIG. 16, when a switching device disposed on a bit line BLB out of a pair of bit lines BL and BLB (or/BL) is turned off, the load of the bit line BLB may be removed or decreased. In this case, a refresh memory cell coupled to the bit line BL may perform a restoring operation. Herein, a sense amplifier may perform a sensing and amplifying operation with no influence on the load of the bit line BLB. For example, referring to FIG. 14B, when a refresh operation is performed on the right-side memory cells of the cell matrix CM1 coupled to the bit line BL1, if the switching device SW 6812 is turned off, the sense amplifier 6800-12 may perform a sensing and amplifying operation with no influence on the load of the bit line BL2.

As described above, according to the embodiments of the present disclosure, a near memory cell positioned relatively close to a sense amplifier and a far memory cell positioned relatively far from the sense amplifier may be coupled to each other or decoupled from each other by a switching device in a cell matrix included in a DRAM among a plurality of DRAMs that may be included in a converged memory device such as a memory blade. When the far memory cell is decoupled from the near memory cell, a processing rate of the cell matrix may be improved, and a refresh power of the cell matrix may be decreased. Consequently, the performance of the converged memory device may be improved.

Figure 17A:
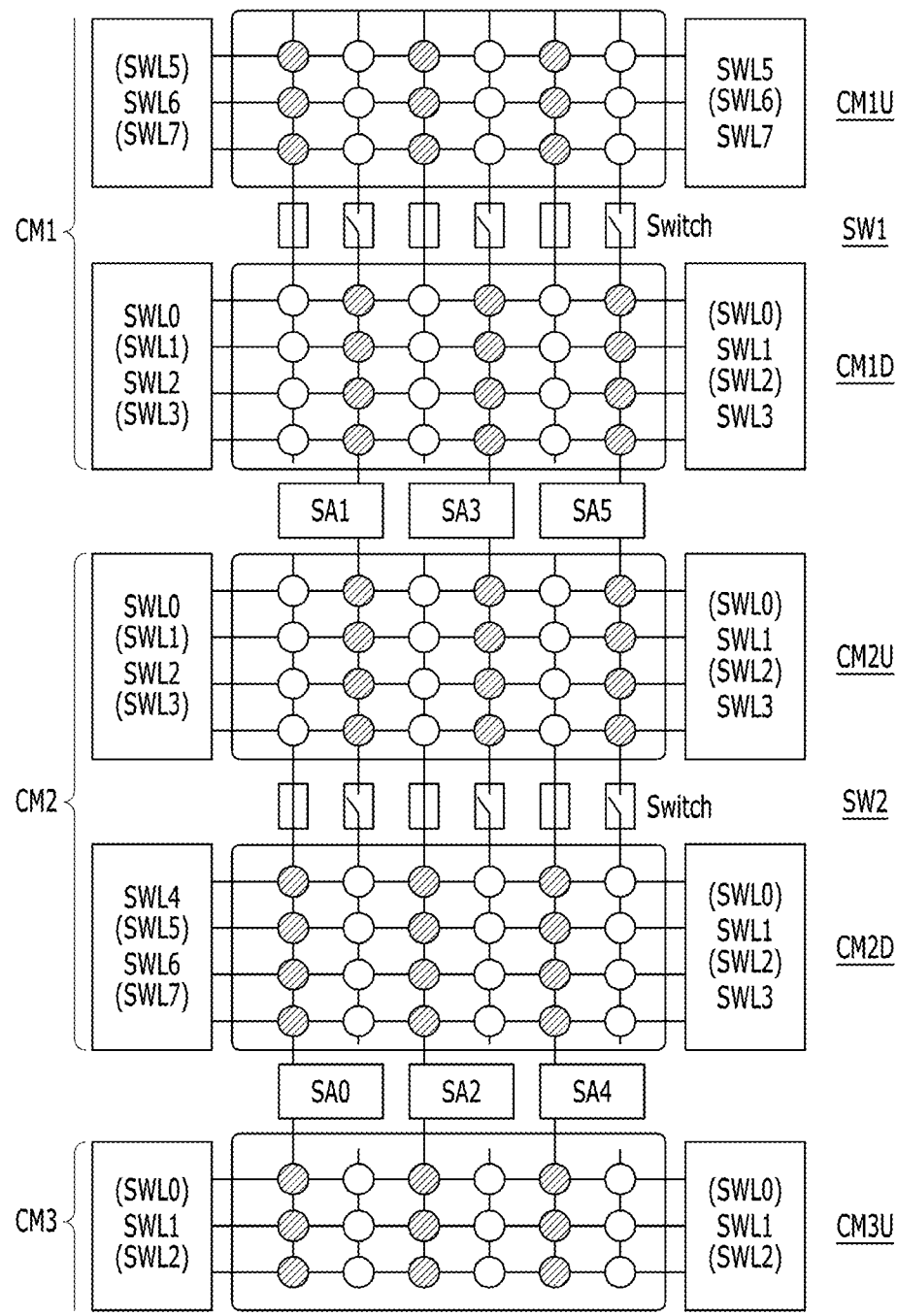
FIGS. 17A and 17B each illustrate a cell matrix having an asymmetrical bit line structure in accordance with an embodiment of the present disclosure.

FIG. 17A illustrates a cell matrix of a DRAM having an asymmetrical bit line structure in accordance with an embodiment of the present disclosure.

Referring to FIG. 17A, the DRAM may include a first cell matrix CM1, a second cell matrix CM2, a third cell matrix CM3, sense amplifiers SA1, SA3, and SA5, and sense amplifiers SA0, SA2, and SA4. The sense amplifiers SA1, SA3, and SA5 are disposed between the first cell matrix CM1 and the second cell matrix CM2, and the sense amplifiers SA0, SA2, and SA4 are disposed between the second cell matrix CM2 and the third cell matrix CM3.

The first cell matrix CM1 may include a plurality of lower memory cells CM1D, which are disposed between a plurality of word lines SWL0 to SWL3 and bit lines, and a plurality of upper memory cells CM1U, which are disposed between a plurality of word lines SWL5 to SWL7 and the bit lines. The first cell matrix CM1 may further include first switching devices SW1 that are disposed at a central part of the first cell matrix CM1. The first switching devices SW1 may be coupled to the bit lines between the upper memory cells CM1U and the lower memory cells CM1D. In an embodiment, the number of the upper memory cells CM1U and the number of the lower memory cells CM1D may be the same. The first switching devices SW1 may couple or decouple the upper memory cells CM1U to or from the lower memory cells CM1D.

In the first cell matrix CM1, right-side memory cells that are coupled to the sense amplifier SA1 may be divided into lower right-side memory cells CM1D, which are disposed at positions that are relatively close to the sense amplifier SA1, and upper right-side memory cells CM1U, which are disposed at positions that are relatively far from the sense amplifier SAL The lower right-side memory cells CM1D and the upper right-side memory cells CM1U, among the right-side memory cells coupled to the sense amplifier SA1, may be isolated from each other by a corresponding one of the first switching devices SW1.

In the first cell matrix CM1, right-side memory cells coupled to the sense amplifier SA3 may be divided into lower right-side memory cells CM1D, which are disposed at positions that are relatively close to the sense amplifier SA3, and upper right-side memory cells CM1U, which are disposed at positions that are relatively far from the sense amplifier SA3. The lower right-side memory cells CM1D and the upper right-side memory cells CM1U may be isolated from each other by a corresponding one of the first switching devices SW1.

In the first cell matrix CM1, right-side memory cells coupled to the sense amplifier SA5 may be divided into lower right-side memory cells CM1D, which are disposed relatively close to the sense amplifier SA5, and upper right-side memory cells CM1U, which are disposed relatively far from the sense amplifier SA5. The lower right-side memory cells CM1D and the upper right-side memory cells CM1U may be isolated from each other by a corresponding one of the first switching devices SW1.

The second cell matrix CM2 may include a plurality of upper memory cells CM2U, which are disposed between the word lines SWL0 to SWL3 and bit lines, and a plurality of lower memory cells CM2D, which are disposed between the word lines SWL4 to SWL7 and the bit lines. The second cell matrix CM2 may further include second switching devices SW2 that are disposed at a central part of the second cell matrix CM2. The second switching devices SW2 may be coupled to the bit lines between the upper memory cells CM2U and the lower memory cells CM2D, where the number of the upper memory cells CM2U and the number of the lower memory cells CM2D may be the same. The second switching devices SW2 may couple or decouple the upper memory cells CM2U to or from the lower memory cells CM2D.

In the second cell matrix CM2, right-side memory cells that are coupled to the sense amplifier SA1 may be divided into upper right-side memory cells CM2U, which are disposed relatively close to the sense amplifier SA1, and lower right-side memory cells CM2D, which are disposed relatively far from the sense amplifier SA1. The upper right-side memory cells CM2U and the lower right-side memory cells CM2D may be isolated from each other by a corresponding one of the second switching devices SW2.

In the second cell matrix CM2, right-side memory cells that are coupled to the sense amplifier SA3 may be divided into upper right-side memory cells CM2U, which are disposed at positions that are relatively close to the sense amplifier SA3, and lower right-side memory cells CM2D, which are disposed at positions that are relatively far from the sense amplifier SA3. The upper right-side memory cells CM2U and the lower right-side memory cells CM2D may be isolated from each other by a corresponding one of the second switching devices SW2.

In the second cell matrix CM2, right-side memory cells that are coupled to the sense amplifier SA5 may be divided into upper right-side memory cells CM2U, which are disposed relatively close to the sense amplifier SA5, and lower right-side memory cells CM2D, which are disposed relatively far from the sense amplifier SA5. The upper right-side memory cells CM2U and the lower right-side memory cells CM2D may be isolated from each other by a corresponding one of the second switching devices SW2.

In the second cell matrix CM2, left-side memory cells that are coupled to the sense amplifier SA0 may be divided into lower left-side memory cells CM2D, which are disposed relatively close to the sense amplifier SA0, and upper left-side memory cells CM2U, which are disposed relatively far from the sense amplifier SA0. The lower left-side memory cells CM2D and the upper left-side memory cells CM2U may be coupled to each other by a corresponding one of the second switching devices SW2.

In the second cell matrix CM2, left-side memory cells that are coupled to the sense amplifier SA2 may be divided into lower left-side memory cells CM2D, which are disposed relatively close to the sense amplifier SA2, and upper left-side memory cells CM2U, which are disposed relatively far from the sense amplifier SA2. The lower left-side memory cells CM2D and the upper left-side memory cells CM2U may be coupled to each other by a corresponding one of the second switching devices SW2.

In the second cell matrix CM2, left-side memory cells that are coupled to the sense amplifier SA4 may be divided into lower left-side memory cells CM2D, which are disposed relatively close to the sense amplifier SA4, and upper left-side memory cells CM2U, which are disposed relatively far from the sense amplifier SA4. The lower left-side memory cells CM2D and the upper left-side memory cells CM2U may be coupled to each other by a corresponding one of the second switching devices SW2.

The switching devices SW1 and SW2 may be turned on or off under the control of the controller 410 illustrated in FIG. 12A. When a word line is enabled and a sense amplifier is enabled, the controller 410 may detect a position of the enabled word line based on address information, and control the switching devices SW1 and SW2 based on the detected position of the enabled word line. When memory cells that are disposed relatively far from the sense amplifier are decoupled from the sense amplifier by controlling the switching devices SW1 and SW2, the decoupled memory cells are not regarded as loading targets. In this way, memory cells that are disposed close to the sense amplifier may attain an improved Delta-V due to the improvement in a Cb/Cs ratio, and an improved operation rate and reduced operation current consumption due to the decrease in the loading that occurs when the sense amplifier is enabled.

For example, when the word line SWL1 of the second cell matrix CM2 is enabled, the sense amplifiers SA1, SA3, and SA5 may sense the near memory cells CM2U and may not load the far memory cells CM2D, which are decoupled from the near memory cells, by controlling the switching devices SW2. Therefore, the near memory cells CM2U may attain a higher Delta-V, an improved operation rate, and a reduced operation current consumption due to the decrease in bit line loading. Conversely, when the word line SWL1 of the second cell matrix CM2 is enabled, the sense amplifiers SA0, SA2, and SA4 and the lower memory cells CM2D are in a region far from the word line SWL1, and the coupling between the lower memory cells CM2D and the upper memory cells CM2U may be maintained through the switching devices SW2. In short, half of the entire group of enabled memory cells may become near memory cells that are disposed close to a sense amplifier, and the other half of the group may become far memory cells that are disposed far from the sense amplifier.

Therefore, when an operation such as a read operation, a write operation, an access operation, or a refresh operation is performed in one DRAM chip, half of the entire group of memory cells may have an improved operation rate, and thus their power consumption may be decreased. In other words, it is possible to improve an operation rate and power consumption of near memory cells that are disposed close to a sense amplifier by properly controlling switching devices that are disposed between one upper half of the entire memory cells and the other lower half of the entire memory cells. Therefore, if a controller is capable of properly allocating a memory in a converged memory device, such as a pooled memory, in consideration of what is described above, the overall performance of a system including the converged memory device may be improved. In addition, the converged memory device, which converges DRAMs that have an asymmetrical bit line structure, may divide the DRAMs into fast DRAMs and normal DRAMs by adjusting the number of the fast DRAMs and the number of the normal DRAMs, and may use the DRAMs as virtual memories.

Figure 17B:
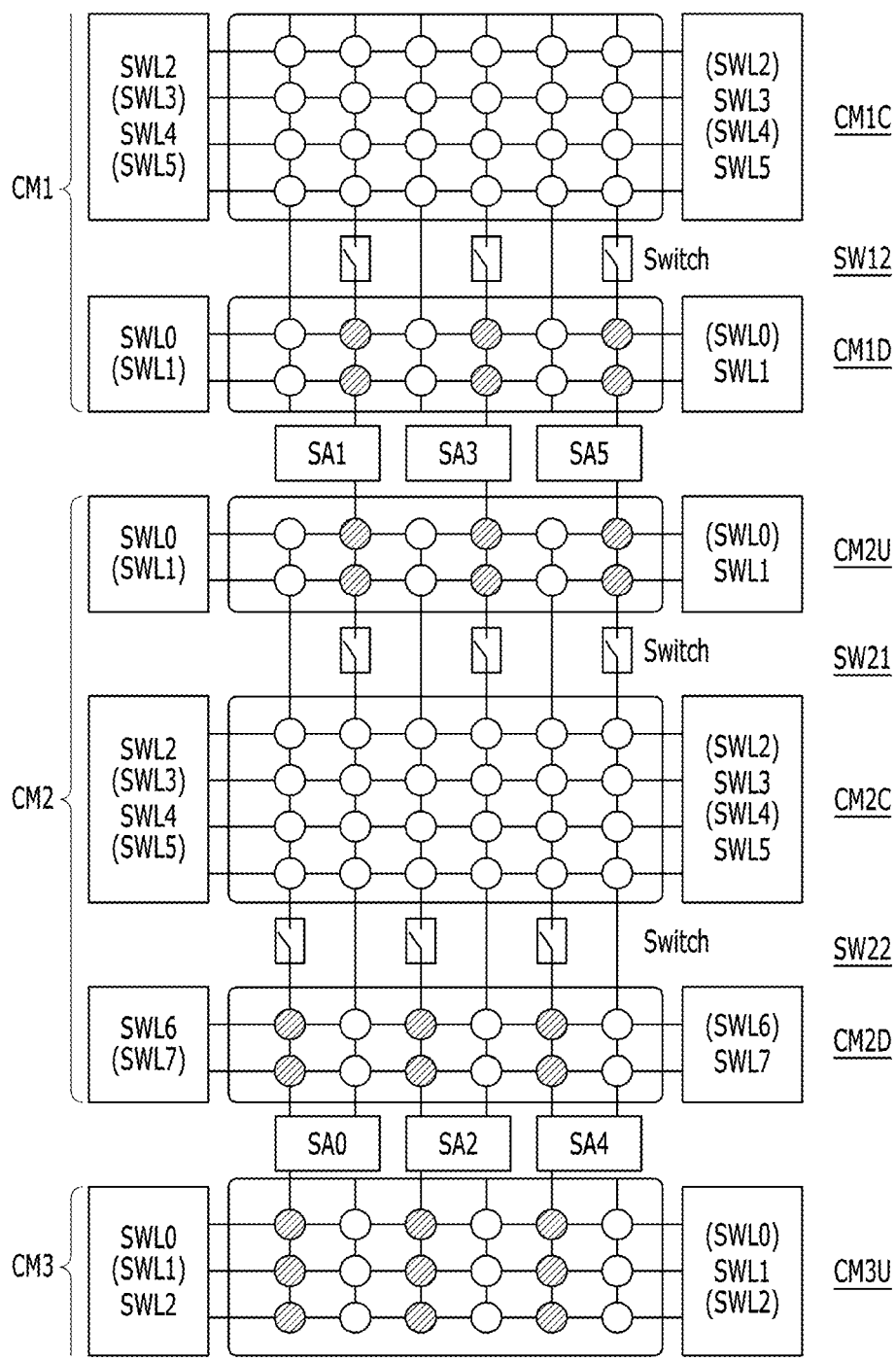

FIG. 17B illustrates a cell matrix of a DRAM having an asymmetrical bit line structure in accordance with an embodiment of the present disclosure.

Referring to FIG. 17B, the DRAM may include a first cell matrix CM1, a second cell matrix CM2, a third cell matrix CM3, sense amplifiers SA1, SA3, and SA5, and sense amplifiers SA0, SA2, and SA4. The sense amplifiers SA1, SA3, and SA5 are disposed between the first cell matrix CM1 and the second cell matrix CM2. The sense amplifiers SA0, SA2, and SA4 are disposed between the second cell matrix CM2 and the third cell matrix CM3.

The first cell matrix CM1 may include a plurality of lower memory cells CM1D, which are disposed between a plurality of word lines SWL0 to SWL2 and bit lines, a plurality of central memory cells CM1C, which are disposed between a plurality of word lines SWL2 to SWL5 and the bit lines, and a plurality of upper memory cells (not shown). The first cell matrix CM1 may further include switching devices SW12 that are disposed between the central memory cells CM1C and the lower memory cells CM1D. For example, the switching devices SW12 may be disposed at a ¼ position of the first cell matrix CM1 from the sense amplifiers SA1, SA3, and SA5. That is, the switching devices SW12 may be disposed ¼ of a distance from the sense amplifiers SA1, SA3, and SA5 to the first cell matrix CM1. The switching devices SW12 may be coupled to the bit lines between the central memory cells CM1C and the lower memory cells CM1D, so as to couple or decouple the central memory cells CM1C to or from the lower memory cells CM1D.

The second cell matrix CM2 may include a plurality of upper memory cells CM2U, which are disposed between a plurality of word lines SWL0 and SWL1 and bit lines, a plurality of central memory cells CM2C, which are disposed between a plurality of word lines SWL2 to SWL5 and the bit lines, and a plurality of lower memory cells CM2D, which are disposed between a plurality of word lines SWL6 and SWL7 and the bit lines. The second cell matrix CM2 may further include switching devices SW21, which are disposed between the upper memory cells CM2U and the central memory cells CM2C, as well as switching devices SW22, which are disposed between the central memory cells CM2C and the lower memory cells CM2D.

For example, the switching devices SW21 may be disposed at a ¼ position of the second cell matrix CM2 from the sense amplifiers SA1, SA3, and SA5, and the switching devices SW22 may be disposed at a ¼ position of the second cell matrix CM2 from the sense amplifiers SA0, SA2, and SA4. The switching devices SW21 may be coupled to the bit lines between the upper memory cells CM2U and the central memory cells CM2C, where the number of the upper memory cells CM2U and the number of the central memory cells CM2C are different from each other. The switching devices SW21 may couple or decouple the upper memory cells CM2U to or from the central memory cells CM2C. The switching devices SW22 may be coupled to the bit lines between the central memory cells CM2C and the lower memory cells CM2D, where the number of the lower memory cells CM2D and the number of the central memory cells CM2C are different from each other. The switching devices SW22 may couple or decouple the central memory cells CM2C to or from the lower memory cells CM2D.

The switching devices SW12, SW21, and SW22 may be turned on or off under the control of the controller 410 illustrated in FIG. 12A. When a word line is enabled and a sense amplifier is enabled, the controller 410 may detect a position of the enabled word line based on address information, and control the switching devices SW12, SW21, and SW22 based on the detected position of the enabled word line. When far memory cells, which are disposed relatively far from the sense amplifier, are decoupled from the sense amplifier by controlling the switching devices, the far memory cells are not regarded as loading targets. In this way, near memory cells, which are disposed relatively close to the sense amplifier, may attain an improved Delta-V due to the improvement in a Cb/Cs ratio. Furthermore, an improved operation rate and reduced operation current consumption is enabled, due to the decrease in the loading that occurs when the sense amplifier.

Compared with the structure of FIG. 17A, the structure of FIG. 17B has a modified structure in which switching devices are disposed at a ¼ position of a cell matrix from a sense amplifier. In this case, the number of near memory cells that are relatively close to the sense amplifier may be decreased. As illustrated in FIG. 17A, when switching devices are disposed in a central area of the entire memory cells, i.e., at a ½ position that is ½ of the distance from a sense amplifier, the number of fast memory cells may be half of a total number of memory cells in a cell matrix, i.e., approximately 50% of the total number of memory cells in the cell matrix. However, as illustrated in FIG. 17B, when the switching devices are disposed close to the sense amplifier, i.e., at a ¼ position from the sense amplifier, the number of near memory cells that are used as fast memory cells may be a fourth of the total number of memory cells in the cell matrix, i.e., approximately 25% of the total number of memory cells in the cell matrix. Even through the number of fast memory cells is decreased, a Delta-V characteristic for each of the fast memory cells originating from a length of bit lines that becomes short may be even more improved. In other words, when the length of the bit lines shortens by half, a Delta-V for a memory cell may be improved twice as much as the Delta-V before the length of the bit lines is shortened. Since the bit lines are short, an operation rate of the memory cell may be improved and thus the power consumption of the memory cell may be reduced. Compared with the structure of FIG. 17A, the structure of the cell matrix illustrated in FIG. 17B may have more improvement even though the number of improved memory cells is decreased. According to another embodiment of the present disclosure, the switching devices may be disposed at a ⅙ position of the cell matrix from the sense amplifier, which will be described with reference to FIG. 21A. According to yet another embodiment of the present disclosure, the switching devices may be disposed at a ⅛ position of the cell matrix from the sense amplifier.

Described in the above are the cases of disposing and using the switching devices at the particular fixed positions in the cell matrix, such as at a ½ position, a ¼ position, a ⅙ position, and a ⅛ position, from the sense amplifier. However, if the switching devices are properly disposed in the cell matrix, the switching devices may be variably used. For example, when the switching devices are disposed at the ½ position and the ¼ position of the cell matrix from the sense amplifier, the switching devices disposed at the ½ position or the ¼ position may be controlled according to the type of request processed by the cell matrix. For example, when a request should be processed relatively quickly, the request is processed by controlling the switching devices disposed in the ¼ position. In contrast, when a request should be processed at an intermediate operation rate, the request is processed by controlling the switching devices disposed in the ½ position.

Figure 18A:
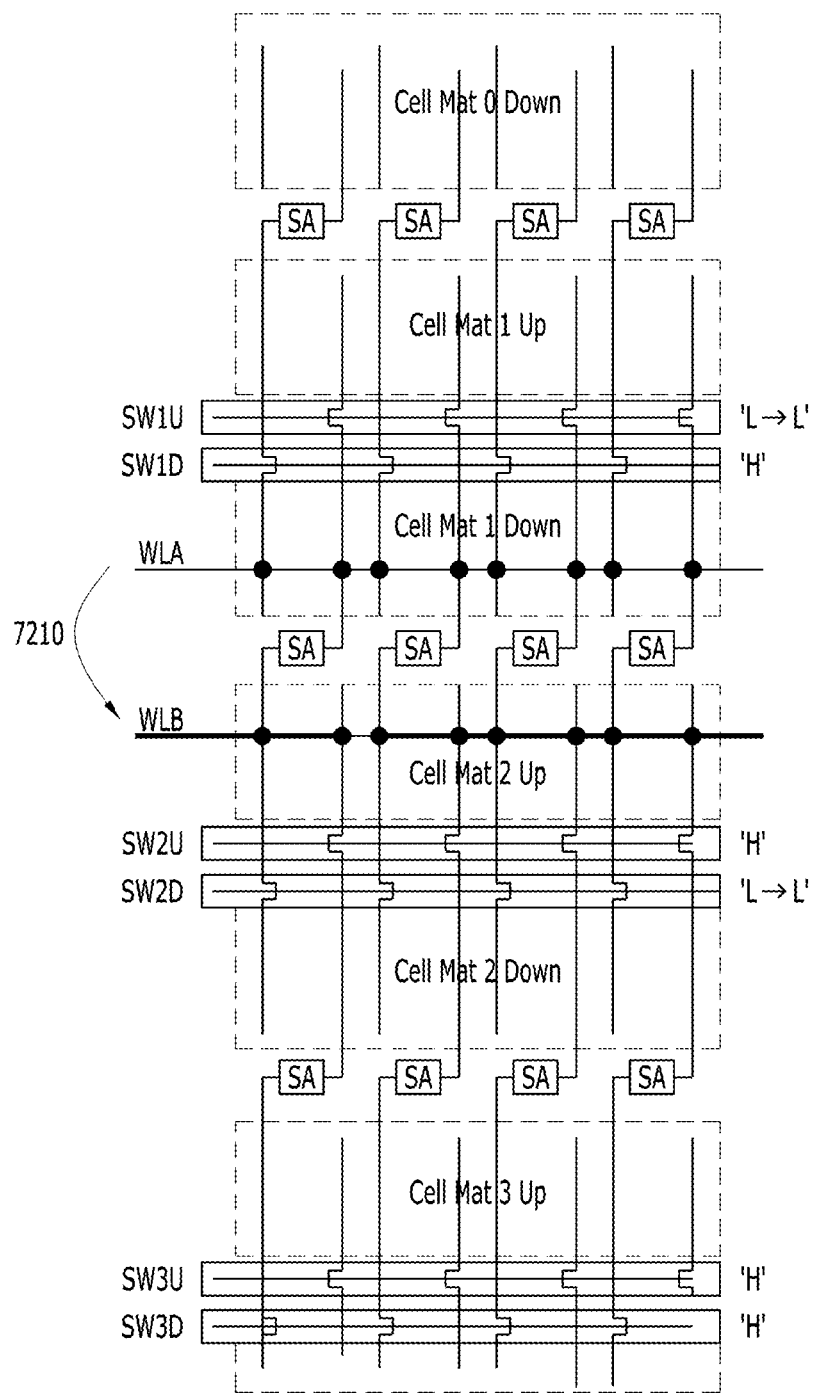
FIGS. 18A and 18B each illustrate a switch control operation in a cell matrix having an asymmetrical bit line structure in accordance with an embodiment of the present disclosure.
Figure 18B:
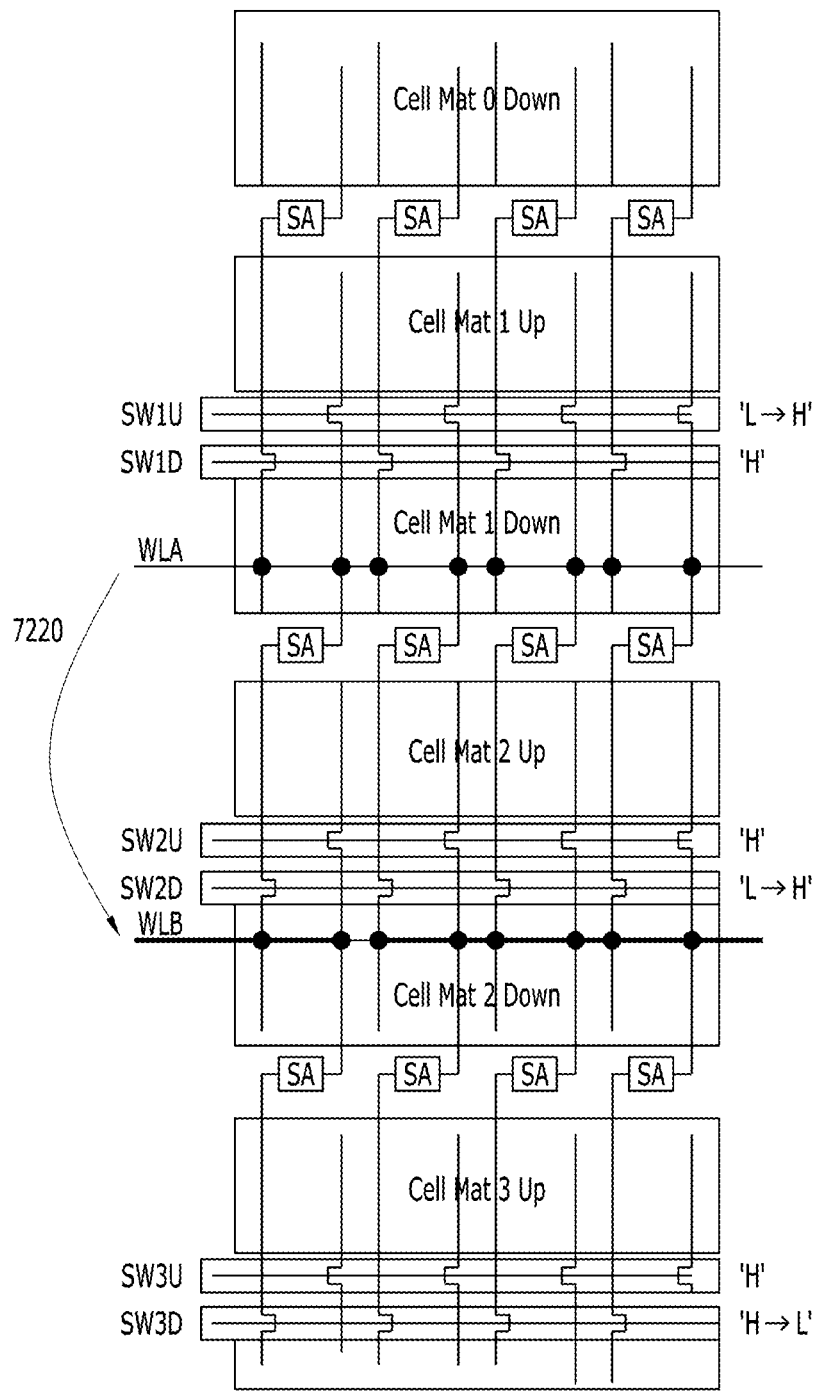

FIGS. 18A and 18B illustrate a switch control operation in a cell matrix having an asymmetrical bit line structure in accordance with an embodiment of the present disclosure.

Referring to FIGS. 18A and 18B, a DRAM may include a $0^{th}$ lower cell matrix (Cell Mat 0 Down), a first upper cell matrix (Cell Mat 1 Up), a first lower cell matrix (Cell Mat 1 Down), a second upper cell matrix (Cell Mat 2 Up), a second lower cell matrix (Cell Mat 2 Down), a third upper cell matrix (Cell Mat 3 Up), and a third lower cell matrix (not shown).

Switching devices may be disposed between cell matrices. Switching devices SW1U and SW1D may be disposed between the first upper cell matrix (Cell Mat 1 Up) and the first lower cell matrix (Cell Mat 1 Down). Switching devices SW2U and SW2D may be disposed between the second upper cell matrix (Cell Mat 2 Up) and the second lower cell matrix (Cell Mat 2 Down). Switching devices SW3U and SW3D may be disposed between the third upper cell matrix (Cell Mat 3 Up) and the third lower cell matrix (not shown).

When a word line WLA corresponding to the first lower cell matrix (Cell Mat 1 Down) is enabled, the switching devices SW1U and SW2D, which are coupled to sense amplifiers disposed close to the first lower cell matrix (Cell Mat 1 Down), are turned off (L), and the switching devices SW1D and SW2U, which are coupled to the other sense amplifiers, are turned on (H). When the switching devices SW1U are turned off, the first upper cell matrix (Cell Mat 1 Up) may be decoupled from the first lower cell matrix (Cell Mat 1 Down), and thus, the first lower cell matrix (Cell Mat 1 Down) corresponding to the activated word line WLA may operate as fast memory cells.

After the word line WLA is enabled, as illustrated in FIG. 18A, when a word line WLB corresponding to the second upper cell matrix (Cell Mat 2 Up) is enabled (7210), the switching devices SW1U and SW2D, which are coupled to the sense amplifiers disposed close to the second upper cell matrix (Cell Mat 2 Up), remain turned off (L), and the switching devices SW1D and SW2U remain turned on (H). At this time, the switching devices SW3U and SW3D remains turned on (H). When the switching devices SW2D are turned off, the second lower cell matrix (Cell Mat 2 Down) may be decoupled from the second upper cell matrix (Cell Mat 2 Up), and thus, the second upper cell matrix (Cell Mat 2 Up) corresponding to the activated word line WLB may operate as fast memory cells.

Meanwhile, after the word line WLA is enabled, as illustrated in FIG. 18B, when a word line WLB corresponding to the second lower cell matrix (Cell Mat 2 Down) is enabled (7220), the switching devices SW1U and SW2D, which are coupled to the sense amplifiers, are turned on (H), and the switching devices SW1D and SW2U remain turned on (H). At this time, the switching devices SW3U remain turned on (H), but the switching devices SW3D are turned off (L). When the switching devices SW2D are turned on, the second lower cell matrix (Cell Mat 2 Down) may be coupled to the second upper cell matrix (Cell Mat 2 Up), and thus, the second lower cell matrix (Cell Mat 2 Down) corresponding to the activated word line WLB may operate as normal memory cells.

Figure 19:
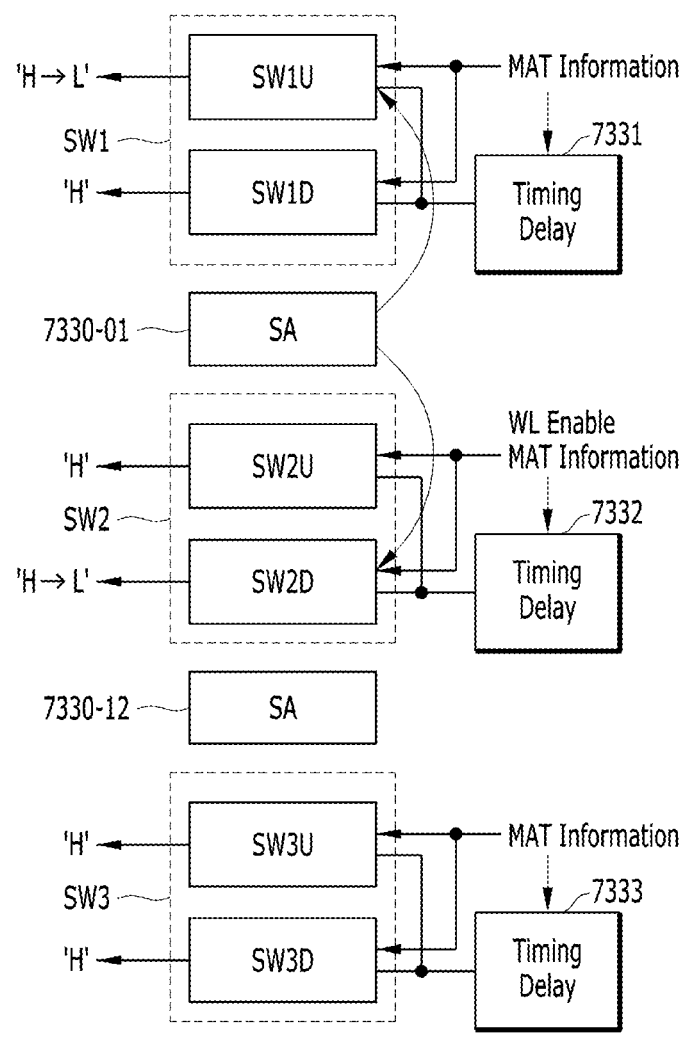
FIG. 19 illustrates a switch control operation for a cell matrix having an asymmetrical bit line structure in accordance with an embodiment of the present disclosure.

FIG. 19 illustrates a switch control operation for a cell matrix having an asymmetrical bit line structure in accordance with an embodiment of the present disclosure. FIG. 19 shows a switch control operation of the switching devices SW1U, SW1D, SW2U, SW2D, SW3U, and SW3D illustrated in FIG. 18A. The switch control operation may be controlled by the controller 410 illustrated in FIG. 12A.

Referring to FIG. 19, each of the switching devices may receive cell matrix information and delayed cell matrix information, which is obtained through a timing delay unit, and perform a switching operation in response to the received information. For example, the switching devices SW1 may receive cell matrix information and delayed cell matrix information, which is obtained through a timing delay unit 7331, and may perform a switching operation in response to the received information.

When a word line coupled to the switching device SW2U is enabled, the switching devices SW2 may receive cell matrix information and delayed cell matrix information from a timing delay unit 7332, and perform a switching operation in response to the received information. When there is an enabled word line, switching devices, which are coupled to the sense amplifier that is disposed the closest to the enabled word line, may be turned off. For example, as illustrated in FIGS. 18A and 19, the switching devices SW1U and SW2D coupled to a bit line that is coupled to a sense amplifier 7330-01 that is disposed the closest to the enabled word line may be disabled from 'H' to 'L'. The switching devices SW3 may receive cell matrix information and delayed cell matrix information, which is obtained through a timing delay unit 7333, and perform a switching operation in response to the received information.

Figure 20A:
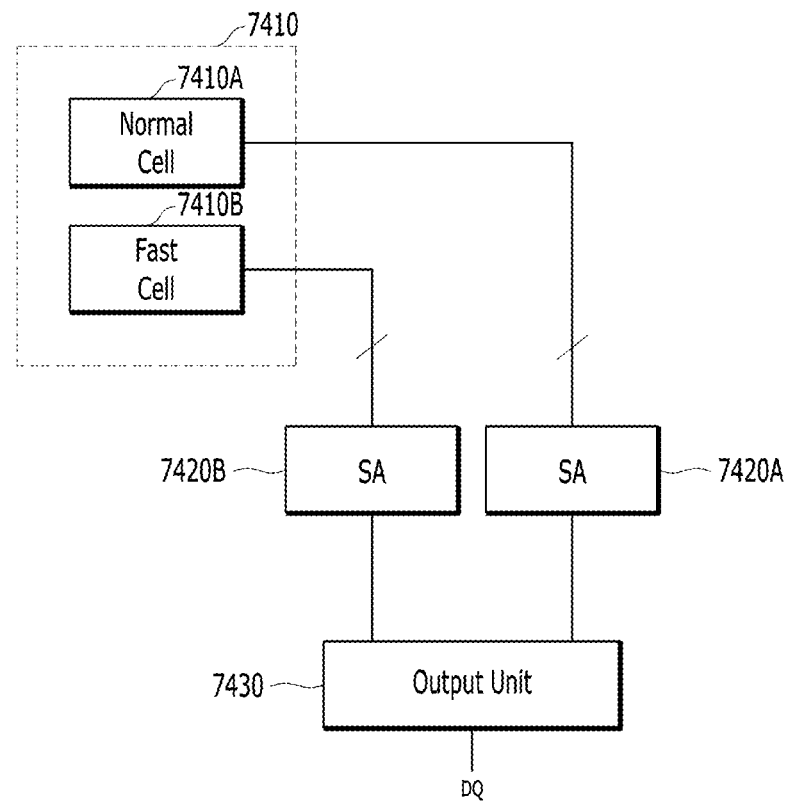
FIGS. 20A and 20B illustrate a pre-fetch operation in a cell matrix in accordance with an embodiment of the present disclosure.
Figure 20B:
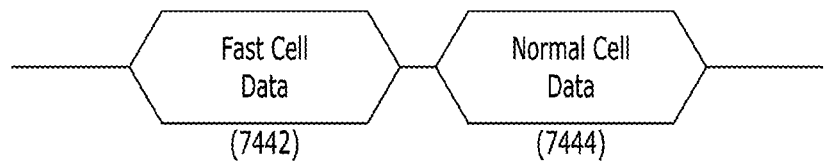

FIGS. 20A and 20B illustrate a pre-fetch operation in a cell matrix in accordance with an embodiment of the present disclosure.

Referring to FIG. 20A, a cell matrix 7410 may include a normal cell 7410A and a fast cell 7410B. Input/output sense amplifiers 7420A and 7420B and an output unit 7430 may be disposed on a data path between the cell matrix 7410 and a data pad DQ.

The fast cell 7410B, as described above, may represent a memory cell whose data access rate is increased due to an operation of a switching device included in the cell matrix in accordance with the embodiments of the present disclosure. Since the fast cell 7410B may be relatively close to the sense amplifier, a physical distance between the fast cell 7410B and the data pad DQ is relatively short. Conversely, the normal cell 7410A may represent a memory cell whose data access rate and physical distance to the data pad DQ are normal, compared to the fast cell 7410B.

The input/output sense amplifier 7420A may amplify and output data for the normal cell 7410A. The input/output sense amplifier 7420B may amplify and output data for the fast cell 7410B. The output unit 7430 may output data from the input/output sense amplifier 7420A and the input/output sense amplifier 7420B to the data pad DQ. The output unit 7430 may take an advantage of the fact that a data access time is different according to a position of a memory cell in a cell matrix, and may output data from the fast cell 7410B having the fast data access time first and then output data from the normal cell 7410A having the normal data access time. Alternatively, a pipeline of a typical data output unit may serially output data to a data pad DQ after all data are arrived. Therefore, in this case, the overall data access time may be limited by the slowest data path.

Referring to FIG. 20B, the output unit 7430 may output the data from the fast cell 7410B having the fast data access time first in step 7442, and then output the data from the normal cell 7410A in step 7444. Therefore, the output unit 7430 may be able to solve the problem of the overall data access time being limited by the slowest data path.

FIGS. 21A to 21D illustrate a cloning operation in a cell matrix in accordance with an embodiment of the present disclosure.

Figure 21A:
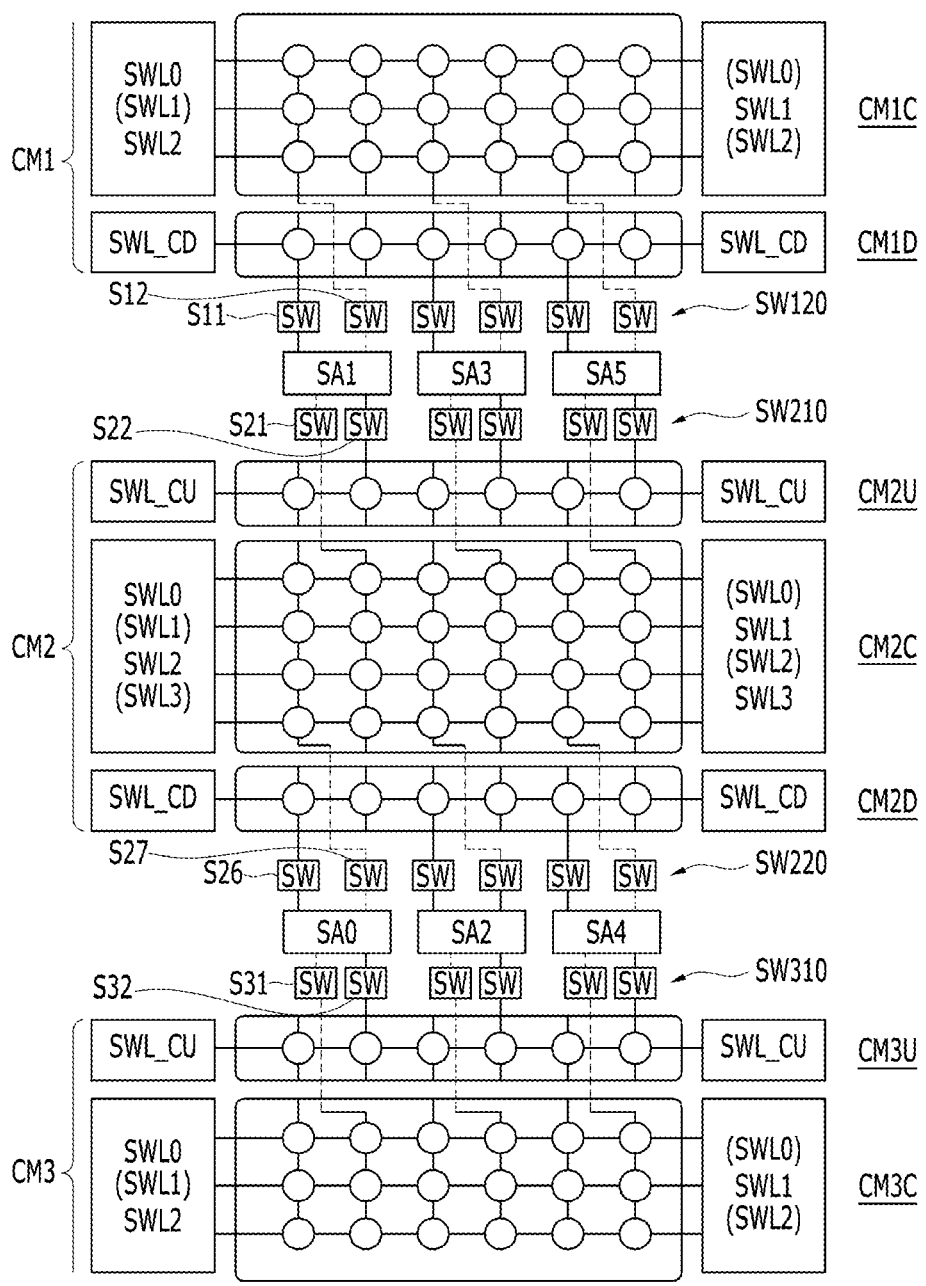
FIGS. 21A to 21D illustrate a cloning operation in a cell matrix in accordance with an embodiment of the present disclosure.

FIG. 21A illustrates a cell matrix of a DRAM in accordance with an embodiment of the present disclosure.

Referring to FIG. 21A, the DRAM may include a first cell matrix CM1, a second cell matrix CM2, a third cell matrix CM3, sense amplifiers SA1, SA3, and SA5, which are disposed between the first cell matrix CM1 and the second cell matrix CM2, and sense amplifiers SA0, SA2, and SA4, which are disposed between the second cell matrix CM2 and the third cell matrix CM3. The DRAM may further include switches SW120 that are coupled between the sense amplifiers SA1, SA3, and SA5 and the first cell matrix CM1, switches SW210 that are coupled between the sense amplifiers SA1, SA3, and SA5 and the second cell matrix CM2, switches SW220 that are coupled between the sense amplifiers SA0, SA2, and SA4 and the second cell matrix CM2, and switches SW310 that are coupled between the sense amplifiers SA0, SA2, and SA4 and the third cell matrix CM3.

The first cell matrix CM1 may include a plurality of lower memory cells CM1D that are disposed between a word line SWL_CD and bit lines, a plurality of central memory cells CM1C that are disposed between a plurality of word lines SWL0 to SWL2 and the bit lines. The central memory cells CM1C may be normal memory cells, and the lower memory cells CM1D may be cloning memory cells. Herein, although it is exemplarily illustrated that the central memory cells CM1C include normal memory cells, the central memory cells CM1C may include both of normal memory cells and fast memory cells, as shown in FIG. 17A or 17B.

The switches SW120 may include switches that are disposed between the sense amplifiers SA1, SA3, and SA5 and cloning memory cells of the first cell matrix CM1, and switches that are disposed between the sense amplifiers SA1, SA3, and SA5 and normal memory cells of the first cell matrix CM1. For example, the switches SW120 may include a switch SW11 and a switch SW12, which are disposed adjacent to each other. The switch SW11 is disposed between the sense amplifier SA1 and the cloning memory cell of the first cell matrix CM1, and the switch SW12 is disposed between the sense amplifier SA1 and the normal memory cell of the first cell matrix CM1. That is, the switch SW11 may couple the sense amplifier SA1 to the cloning memory cell of the first cell matrix CM1, and the switch SW12 may couple the sense amplifier SA1 to the normal memory cell of the first cell matrix CM1.

The second cell matrix CM2 may include a plurality of upper memory cells CM2U that are disposed between a word line SWL_CU and bit lines, a plurality of central memory cells CM2C that are disposed between a plurality of word lines SWL0 to SWL3 and the bit lines, and a plurality of lower memory cells CM2D that are disposed between a word line SWL_CD and the bit lines. The central memory cells CM2C may be normal memory cells, and the upper memory cells CM2U and the lower memory cells CM2D may be cloning memory cells. In the present embodiment, the central memory cells CM2C include only normal memory cells. However, the central memory cells CM2C may also include both of normal memory cells and fast memory cells, as illustrated in FIG. 17A or 17B.

The switches SW210 may include switches that are disposed between the sense amplifiers SA1, SA3, and SA5 and cloning memory cells of the second cell matrix CM2, and switches that are disposed between the sense amplifiers SA1, SA3, and SA5 and normal memory cells of the second cell matrix CM2. For example, the switches SW210 may include a switch SW21 and a switch SW22 that are disposed adjacent to each other. The switching SW210 is disposed between the sense amplifier SA1 and the normal memory cell of the second cell matrix CM2, and the switch SW22 is disposed between the sense amplifier SA1 and the cloning memory cell of the second cell matrix CM2. That is, the switch SW21 may couple the sense amplifier SA1 to a normal memory cell of the second cell matrix CM2, and the switch SW22 may couple the sense amplifier SA1 to a cloning memory cell of the second cell matrix CM2.

The switches SW220 may include switches that are disposed between the sense amplifiers SA0, SA2, and SA4 and cloning memory cells of the second cell matrix CM2, and switches that are disposed between the sense amplifiers SA0, SA2, and SA4 and normal memory cells of the second cell matrix CM2. For example, the switches SW220 may include a switch SW26 and a switch SW27, which are disposed adjacent to each other. The switch SW26 is disposed between the sense amplifier SA0 and a cloning memory cell of the second cell matrix CM2, and the switch SW27 is disposed between the sense amplifier SA0 and a normal memory cell of the second cell matrix CM2. That is, the switch SW26 may couple the sense amplifier SA0 to a cloning memory cell of the second cell matrix CM2, and the switch SW27 may couple the sense amplifier SA0 to a normal memory cell of the second cell matrix CM2.

The third cell matrix CM3 may include a plurality of upper memory cells CM3U that are disposed between a word line SWL_CU and bit lines, and a plurality of central memory cells CM3C that are disposed between a plurality of word lines SWL0 to SWL2 and the bit lines. The central memory cells CM3C may be normal memory cells, and the upper memory cells CM3U may be cloning memory cells. Herein, it is exemplarily illustrated that the central memory cells CM3C include only normal memory cells. However, the central memory cells CM3C may include both of normal memory cells and fast memory cells, as illustrated in FIG. 17A or 17B.

The switches SW310 may include switches that are disposed between the sense amplifiers SA0, SA2, and SA4 and cloning memory cells of the third cell matrix CM3, and switches that are disposed between the sense amplifiers SA0, SA2, and SA4 and normal memory cells of the third cell matrix CM3. For example, the switches SW310 may include a switch SW31 and a switch SW32, which are disposed adjacent to each other. The switch SW31 is disposed between the sense amplifier SA0 and a normal memory cell of the third cell matrix CM3, and the switch SW32 is disposed between the sense amplifier SA0 and a cloning memory cell of the third cell matrix CM3. That is, the switch SW31 may couple the sense amplifier SA0 to a normal memory cell of the third cell matrix CM3, and the switch SW32 may couple the sense amplifier SA0 and a cloning memory cell of the third cell matrix CM3.

In various embodiments of the present disclosure, cloning memory cells included in cell matrices may be disposed relatively close to a sense amplifier, and normal memory cells included in the cell matrices may be disposed relatively far from the sense amplifier. If it is possible to make a data access to a cloning memory cell disposed close to the sense amplifier instead of making a data access to a normal memory cell disposed far from the sense amplifier, a data access rate may be increased and bit line loading may be minimized. As a result, power consumption of the cell matrices may be reduced.

Figure 21B:
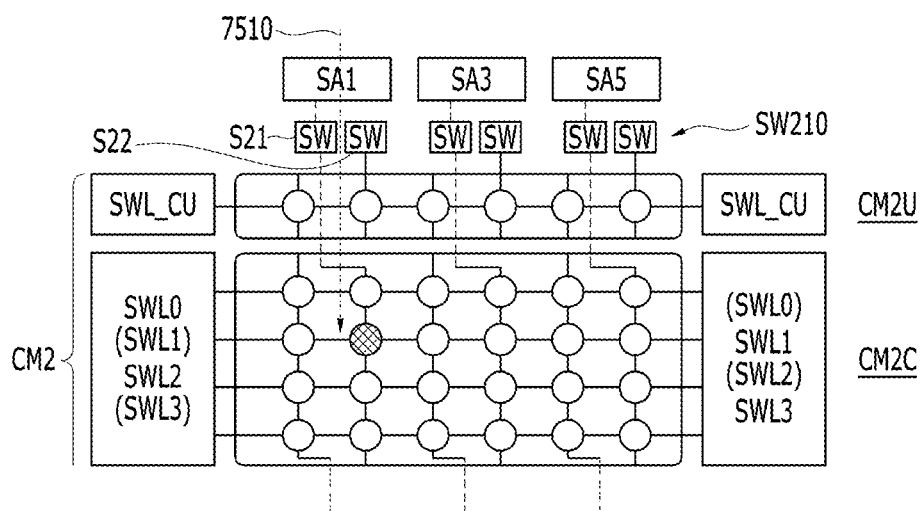
Figure 21C:
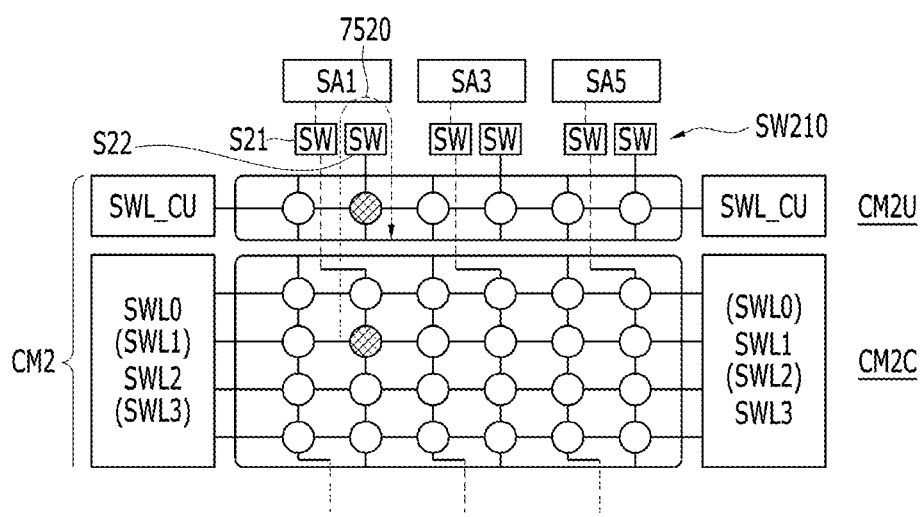
Figure 21D:
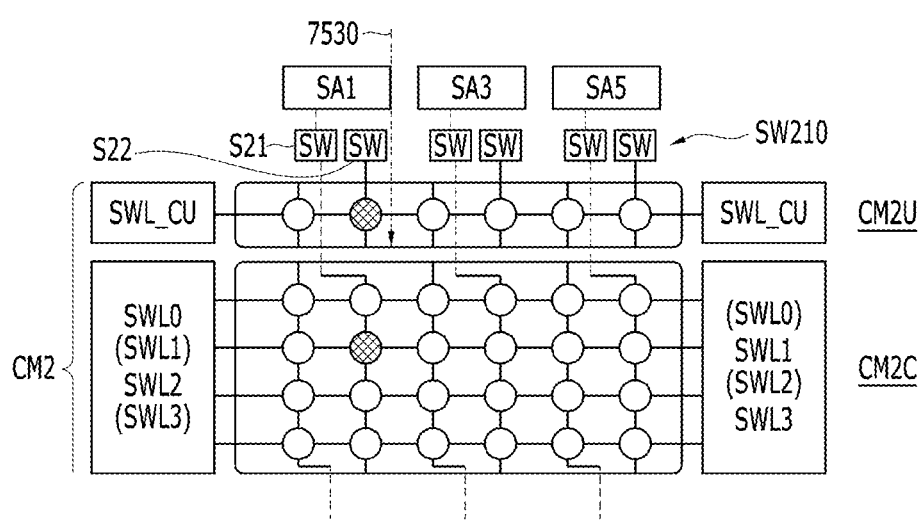

FIGS. 21B to 21D show a cloning operation in a cell matrix of the DRAM illustrated in FIG. 21A in accordance with an embodiment of the present disclosure. Herein, a cloning operation in the second cell matrix CM2 including the normal memory cells CM2C and the cloning memory cells CM2U is exemplarily illustrated. However, a cloning operation by other cloning memory cells may be performed similarly. Since the cloning operation makes it possible to make a data access not to the normal memory cells disposed far from the sense amplifier but to the cloning memory cells disposed close to the sense amplifier, the data access rate of the DRAM may be higher and bit line loading may be minimized. As a result, power consumption may be reduced.

Referring to FIG. 21B, data may be stored in the normal memory cells CM2C that are disposed relatively far from the sense amplifier SA1 among the memory cells included in the second cell matrix CM2. For example, data may be stored in a memory cell corresponding to the word line SWL1 among the normal memory cells CM2C through the switch SW21 which is turned on in step 7510.

Referring to FIG. 21C, data stored in the memory cell corresponding to the word line SWL1 among the normal memory cells CM2C may be cloned into some cloning memory cells among the cloning memory cells CM2U that are disposed relatively close to the sense amplifier SA1 among the memory cells included in the second cell matrix CM2 through the switches SW21 and SW22 that are turned on in step 7520. In various embodiments of the present disclosure, cloning of data may mean copying or moving of the data, and the cloned data may be predetermined data or data of a monitored normal memory cell, such as data of a frequently used page. Although FIG. 21C illustrates that the cloning is copying the data, it may be also illustrated as moving the data.

Referring to FIG. 21D, when an access request for the predetermined data or the data of the monitored normal memory cell is received after the cloning, the data may be accessed not from the normal memory cells CM2C but from the cloning memory cells CM2U in step 7530. In short, the cloned data stored in some cloning memory cells among the cloning memory cells CM2U that are disposed relatively close to the sense amplifier SA1 may be accessed through the switch SW 22 that is turned on. Since this cloned data are processed by accessing data that are not from the normal memory cells disposed far from the sense amplifier but from the cloning memory cells disposed close to the sense amplifier, the data access rate may become higher and bit line loading is minimized. As a result, power consumption may be reduced.

According to the embodiments of the present disclosure described above, near memory cells, which are disposed relatively close to a sense amplifier, and far memory cells, which are disposed relatively far from the sense amplifier, may be distinguished from each other by a switching device in a cell matrix in the inside of one DRAM among a plurality of DRAMs included in a converged memory device, such as a memory blade. When the far memory cells are distinguished from the near memory cells, a data processing rate may be improved and the refresh power may be reduced. Consequently, the performance of the converged memory device may be improved.

While the present invention has been described with respect to specific embodiments, it will be apparent to those skilled in the art that various changes and modifications may be made without departing from the spirit and scope of the invention as determined in the following claims.

What is claimed is:

1. A memory system comprising:
 a memory device including:
  a memory cell array including normal memory cells and redundancy memory cells suitable for replacing failed memory cells among the normal memory cells; and
  a device controller for activating reserved memory cells and generating a first signal associated with the reserved memory cells; and
 a memory controller for assigning an address to enable accessing of the reserved memory cells in response to the first signal.

2. The memory system of claim 1, wherein the memory device further includes a fuse unit storing the address assigned to the reserved memory cells.

3. The memory system of claim 1, wherein the memory device further includes a power management unit separately providing power to the normal memory cells and the redundancy memory cells.

4. The memory system of claim 3, wherein the power management unit selectively provides power to the reserved memory cells according to whether the reserved memory cells are used.

5. The memory system of claim 1, wherein the memory device further includes a switching device disposed between first region memory cells and second region memory cells in order to couple the second region memory cells to a sense amplifier or decouple the second region memory cells from the sense amplifier.

6. The memory system of claim 1, wherein the memory cell array includes a normal memory cell area and a redundancy memory cell area, and the redundancy memory cell area have a replacement memory cell region and a reserved memory cell region.

7. The memory system of claim 6, wherein the memory device further includes a register suitable for generating the first signal indicating existence of the reserved memory cell region.

8. The memory system of claim 6, wherein the memory device further includes a controller suitable for assigning an address for accessing a reserved memory cell of the reserved memory cell region based on the first signal.

9. The memory system of claim 1, wherein the memory controller suitable for control the memory device, when first memory cells are accessed more than a threshold access number, to move data stored in the first memory cells to the reserved memory cells and replace the first memory cells with the reserved memory cells.

10. The memory system of claim 9, wherein the memory controller assigns an address associated with the first memory cells to the reserved memory cells.

11. The memory system of claim 6, wherein the memory device further includes a power management unit separately providing power to the replacement memory cell region and the reserved memory cell region.

12. The memory system of claim 5, wherein when the switching device is enabled, the first region memory cell has a first operation speed, and the second region memory cell has a second operation speed slower than the first operation speed.

13. The memory system of claim 12, wherein when the switching device is disabled, a bit line loading associated with the second region memory cell is decreased, and the first region memory cell has a third operation speed faster than the first operation speed.

14. The memory system of claim 5, wherein when the switching device is enabled, the memory device stores data in the second region memory cell.

15. The memory system of claim 14, wherein when a piece of the data stored in the second region memory is used more often than a threshold number, the memory device moves the piece of the data to the first region memory cell, and when the piece of the data is requested, the memory device accesses the first region memory cell and outputs the piece of the data.

16. The memory system of claim 5, wherein when the switching device is enabled, the memory device operates as a normal mode, and when the switching device is disabled, the memory device operates as a fast mode faster than the normal mode.

17. The memory system of claim 5, wherein the memory controller dynamically sets a mode of each of a plurality of memory devices, based on requests externally provided, by controlling a switching device of each of the plurality of memory devices.

18. The memory system of claim 1, wherein the address is not assigned to access the normal memory cell.

19. The memory system of claim 6, wherein the replacement memory cell region includes a plurality of replacement memory cells replaced with a plurality of failed memory cells included in the normal memory cell area, and the reserved memory cell region includes a plurality of reserved memory cells in a remaining region other than the replacement memory cell region.

* * * * *